United States Patent
Uhrenholt et al.

(10) Patent No.: US 11,586,554 B2
(45) Date of Patent: Feb. 21, 2023

(54) CACHE ARRANGEMENTS FOR DATA PROCESSING SYSTEMS

(71) Applicant: Arm Limited, Cambridge (GB)

(72) Inventors: Olof Henrik Uhrenholt, Lomma (SE); Andrew Brookfield Swaine, Sheffield (GB)

(73) Assignee: Arm Limited, Cambridge (GB)

(*) Notice: Subject to any disclaimer, the term of this patent is extended or adjusted under 35 U.S.C. 154(b) by 167 days.

(21) Appl. No.: 16/937,272

(22) Filed: Jul. 23, 2020

(65) Prior Publication Data
US 2022/0027283 A1    Jan. 27, 2022

(51) Int. Cl.
*G06F 12/0895* (2016.01)
*G06T 1/20* (2006.01)
*H03M 7/30* (2006.01)

(52) U.S. Cl.
CPC ............ *G06F 12/0895* (2013.01); *G06T 1/20* (2013.01); *G06F 2212/1044* (2013.01); *H03M 7/30* (2013.01)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004;
(Continued)

(56) References Cited

U.S. PATENT DOCUMENTS 5,247,638 A * 9/1993 O'Brien .............. G06F 12/0866
711/E12.019
5,875,454 A * 2/1999 Craft .................. G06F 12/0864
711/113
(Continued)

FOREIGN PATENT DOCUMENTS

TW    201709062    3/2017
TW    201710882    3/2017
(Continued)

OTHER PUBLICATIONS

Definition of cache; FOLDOC; Jun. 25, 1997; retrieved from http://foldoc.org/cache on Nov. 19, 2014 (Year: 1997).*
(Continued)

Primary Examiner — Daniel C. Chappell
(74) Attorney, Agent, or Firm — Vierra Magen Marcus LLP

(57) ABSTRACT

A data processing system is provided comprising a cache system configured to transfer data between a processor and memory system. The cache system comprises a cache. When a block of data that is stored in the memory in a compressed form is to be loaded into the cache, the block of data is stored into a group of one or more cache lines of the cache and the associated compression metadata for the compressed block of data is provided as separate side band data.

19 Claims, 11 Drawing Sheets

(58) Field of Classification Search
CPC ........ G06F 2216/00–17; G06F 2221/00–2153;
G06K 9/00–6298; G06N 3/00–126; G06N
5/00–048; G06N 7/00–08; G06N 10/00;
G06N 20/00–20; G06N 99/00–007; G06T
1/00–60; G06V 30/00–43; G11B
20/00–24; G11B 33/00–1493; G11C
11/00–5692; G11C 13/00–06; G11C
14/00–009; G11C 15/00–06; G11C
16/00–3495; G11C 17/00–18; G11C
2207/00–229; G11C 2216/00–30; H01L
25/00–50; H01L 27/00–3293; H01L
2225/00–1094; H03M 7/00–707; H04L
9/00–38; H04L 12/00–66; H04L
41/00–5096; H04L 49/00–9094; H04L
61/00–6095; H04L 67/00–42
See application file for complete search history.

(56) References Cited

U.S. PATENT DOCUMENTS

| | | | |
|---|---|---|---|
| 6,624,761 B2 * | 9/2003 | Fallon ................. | H03M 7/4006 341/51 |
| 7,143,238 B2 * | 11/2006 | Adl-Tabatabai .... | G06F 12/0886 711/170 |
| 8,542,939 B2 | 9/2013 | Nystad | |
| 8,775,495 B2 * | 7/2014 | Lumsdaine .......... | G06K 9/6249 708/607 |
| 8,990,518 B2 | 3/2015 | Nystad | |
| 9,014,496 B2 | 4/2015 | Nystad | |
| 9,116,790 B2 | 8/2015 | Nystad | |
| 9,652,152 B2 * | 5/2017 | Oportus Valenzuela ................... | H03M 7/30 |
| 9,880,762 B1 | 1/2018 | Armangau et al. | |
| 9,996,471 B2 * | 6/2018 | Saidi ................... | G06F 12/0873 |
| 10,116,325 B2 * | 10/2018 | Sekiguchi .............. | H03M 7/30 |
| 10,127,625 B2 * | 11/2018 | Seiler ........................ | G06T 1/20 |
| 2013/0290607 A1 * | 10/2013 | Chang .................. | G06F 9/3842 711/144 |
| 2016/0042491 A1 * | 2/2016 | Croxford ................ | G06T 11/40 345/545 |
| 2017/0003887 A1 | 1/2017 | Chun | |
| 2017/0083450 A1 * | 3/2017 | Seiler ................... | G06F 12/1009 |
| 2017/0371793 A1 * | 12/2017 | Saidi ................... | G06F 12/0895 |

FOREIGN PATENT DOCUMENTS

| | | |
|---|---|---|
| WO | 2016041401 | 3/2016 |
| WO | 2016130915 | 8/2016 |
| WO | 2019/180402 | 9/2019 |
| WO | 2020/099825 | 5/2020 |

OTHER PUBLICATIONS

Definition of separate; Merriam-Webster; May 28, 2020; retrieved from https://web.archive.org/web/20200528170302/https://www.merriam-webster.com/dictionary/separate (Year: 2020).*

S. Hong, P. J. Nair, B. Abali, A. Buyuktosunoglu, K.-H. Kim and M. Healy, "Attaché: Towards Ideal Memory Compression by Mitigating Metadata Bandwidth Overheads," 2018 51st Annual IEEE/ACM International Symposium on Microarchitecture (Micro), 2018, pp. 326-338, doi: 10.1109/MICRO.2018.00034. (Year: 2018).*

A. Arelakis, F. Dahlgren and P. Stenstrom, "HyComp: A hybrid cache compression method for selection of data-type-specific compression methods," 2015 48th Annual IEEE/ACM International Symposium on Microarchitecture (Micro), 2015, pp. 38-49, doi: 10.1145/2830772.2830823. (Year: 2015).*

G. D. Kesavan and A. S. Kumar, "Comparative Study on Data Compression Techniques in Cache to Promote Performance," 2019 IEEE International Conference on Intelligent Techniques in Control, Optimization and Signal Processing (INCOS), 2019, pp. 1-6, doi : 10.1109/INCOS45849.2019.8951324. (Year: 2019).*

G. Pekhimenko, E. Bolotin, N. Vijaykumar, O. Mutlu, T. C. Mowry and S. W. Keckler, "A case for toggle-aware compression for GPU systems," 2016 IEEE International Symposium on High Performance Computer Architecture (HPCA), 2016, pp. 188-200, doi: 10.1109/HPCA.2016.7446064. (Year: 2016).*

Uhrenholt, et al., "Data Processing Systems," U.S. Appl. No. 16/742,556.

Uhrenholt, et al., "Cache Arrangement for Data Processing Systems," U.S. Appl. No. 16/742,495.

Uhrenholt, et al., "Cache Operations in Data Processing Systems," U.S. Appl. No. 16/742,519.

Combined Search and Examination Report dated Apr. 22, 2022, GB Patent Application No. GB2110584.6.

Eldstå128-Damlin et al., "AVR: Reducing Memory Traffic with Approximate Value Reconstruction", Proceedings of the 48th International Conference on Parallel Processing, Aug. 5-8, 2019, pp. 1-10.

Office Action dated Jan. 25, 2022, Taiwan Application No. 110122647.

Combined Search and Examination Report dated Sep. 23, 2022, GB Patent Application No. GB2110584.6.

* cited by examiner

CACHE ARRANGEMENTS FOR DATA PROCESSING SYSTEMS

BACKGROUND

The technology described herein relates to data processing systems, and in particular to cache operations in data processing systems such as graphics processing systems.

Graphics processing operations, which may be performed by a graphics processor (graphics processing unit (GPU)), typically process data in an uncompressed form. When such operations have produced a particular output (e.g. frame), the output data may then be written to an output (e.g. frame) buffer, for example in main memory, for storage before further processing (e.g., display of the frame).

The storage and accessing of the uncompressed data in use can place relatively high storage and/or bandwidth requirements on a graphics processing device (or conversely lead to a loss in performance where such requirements are not met) particularly where, as is typically the case, the output buffer resides in memory that is external to the, e.g., graphics processor. This is particularly significant for mobile and handheld devices that perform graphics processing, as such devices are inherently limited in their, e.g., storage, bandwidth and power resources and capabilities.

To reduce the amount of data that needs to be transferred to and from memory during a graphics processing operation, and the associated power cost of moving such data back and forth, the data may be compressed, e.g., before being written to memory. This allows the data to be stored in a compressed (encoded) format. When the data is required for further processing, the compressed data is then read from memory and decompressed (decoded), such that it is then in a suitable format for the graphics processing operations.

To further assist with such data transfers to and from the graphics processor, a cache may be used for storing data locally to a graphics processing unit while the graphics processing operations using this data are being performed. This helps to reduce the need to fetch data from slower data stores, such as main memory of the graphics processing system.

Although described above in the context of graphics processing, similar considerations also apply to various other instances of data processing where it is desired to reduce the amount of data needed for the storage and/or transmission of a certain piece of information, and wherein it may be desirable to store the data more locally to the data processing unit, e.g. in a cache.

The Applicants believe that there remains scope for improvements to cache operations in data processing systems.

BRIEF DESCRIPTION OF THE DRAWINGS

Various embodiments will now be described, by way of example only, and with reference to the accompanying drawings in which.

Like reference signs are used for like elements in the drawings where appropriate.

DETAILED DESCRIPTION

Figure 1:
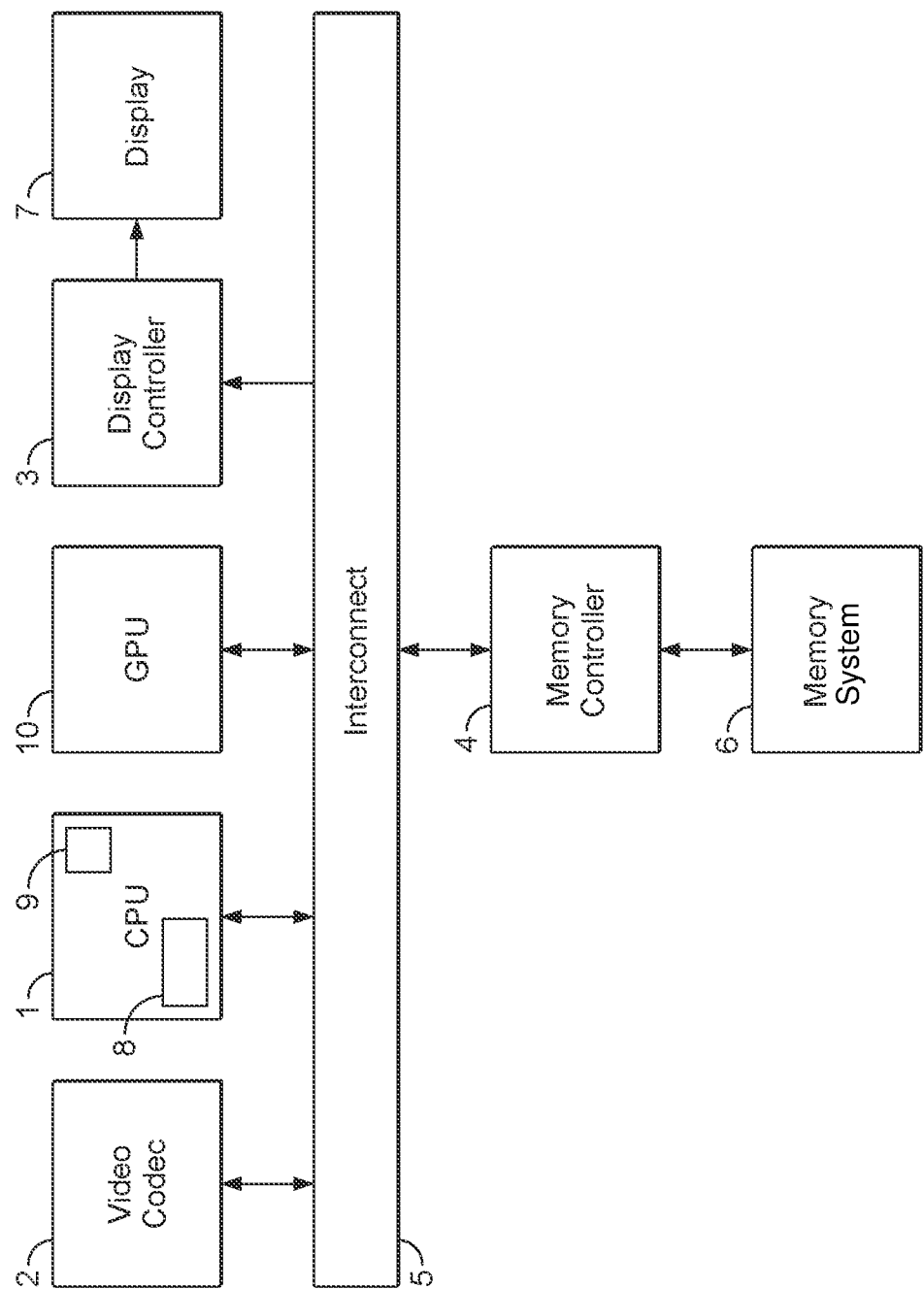
FIG. 1 shows an exemplary graphics processing system in which the technology described herein may be implemented.

A first embodiment of the technology described herein comprises a method of operating a data processing system, the data processing system comprising:
    a processor;
    a memory system; and
    a cache system configured to transfer data stored in the memory system to the processor for use by the processor when performing data processing operations and to transfer data from the processor to the memory system;
    the cache system comprising a cache configured to receive data from the memory and to provide data to the processor for use when performing data processing operations and to receive data from the processor for sending to the memory,
    the cache comprising a plurality of cache lines each able to store a respective data entry;
    the method comprising:
    when a block of data that is stored in the memory in a compressed form is to be loaded into the cache, the compressed block of data having a set of associated compression metadata:
        storing the block of data into a group of one or more cache lines of the cache; and
        providing the compression metadata for the block of data as separate side band data associated with a cache line of the group of one or more cache lines of the cache in which the block of data is stored.

A second embodiment of the technology described herein comprises a data processing system comprising:
    a processor;
    a memory system; and
    a cache system configured to transfer data stored in the memory system to the processor for use by the processor when performing data processing operations and to transfer data from the processor to the memory system;
    the cache system comprising a cache configured to receive data from the memory and to provide data to the processor for use when performing data processing operations and to receive data from the processor for sending to the memory,
    the cache comprising a plurality of cache lines each able to store a respective data entry;
    the data processing system further including:
    a cache control circuit configured to:

when a block of data that is stored in the memory in a compressed form is to be loaded into the cache, the compressed block of data having a set of associated compression metadata:

store the block of data into a group of one or more cache lines of the cache; and obtain the compression metadata for the block of data as separate side band data.

The technology described herein in these embodiments relates to a data processing system that comprises a cache system operable to transfer data from a (e.g. main) memory system to a processor that requires that data and vice versa. For instance, the memory system may store data that may be required by the data processor.

The data processor may be arranged to perform data processing operations (using the data, e.g. in an uncompressed format), such as generating a render output (e.g. a frame, e.g. for display) in the case of a graphics processor. To reduce the amount of data that needs to be transferred to and from memory, the data is stored in the memory system in a compressed form. The compressed data therefore has associated "compression metadata" (which may broadly constitute a part of, and may therefore also be referred to as, "header" data) which may, e.g., and in an embodiment does, include compression parameters, etc., indicating how (and whether) the data has been encoded (compressed) (and, correspondingly, how the data should be decoded (uncompressed), e.g. when it is to be loaded from memory for use by the processor in an uncompressed format).

The cache system includes a cache that is arranged to receive and store data from the memory system, to transfer data from the memory system to the data processor (such that the data processor may use this data to perform data processing operations), and vice versa.

When data is to be written into (or out from) the cache (which data may, e.g., and in an embodiment does, comprise data of a data array that the processor is processing, the data array comprising an array of data elements each having an associated data value(s)), this is done by writing respective blocks of data (which may, e.g., represent a particular region of the data array that the processor is processing) into (or out from) the cache. For example, in the case graphics processing, the overall data array may be an image (frame), and a block of data may, e.g., represent a particular region of the data array that the graphics processor is able to operate on (which region may, e.g., correspond to a tile into which the overall data array (e.g. frame) has been divided into for rendering purposes).

In the technology described herein, in these embodiments, when a memory transaction requires a block of data (e.g. of a data array) that is stored in memory in a compressed form to be loaded from the memory into the cache, the block of data (the payload) is stored in a respective group of one or more cache lines in the cache. At the same time, the compression metadata associated with the block of compressed data is provided to the cache as separate "side band" data and is stored as separate side band data associated with a cache line (or lines) of the group of one or more cache lines in which the block of data is stored.

The compression metadata that is provided in this way as separate side band data can then be read (e.g. by a controller for the cache) and used to determine how, and whether, the block of data should be processed (decoded) into an, e.g. uncompressed, form in which it can be used by the processor.

For instance, in an embodiment, data is stored in the cache in an uncompressed form, and is in an embodiment encoded (compressed) as it is written out from the cache to the memory system (and correspondingly is decoded (decompressed) as it is written from the memory system into the cache), as will be explained further below.

In an embodiment the block(s) of data are written to (and stored in) memory using a block-based encoding (compression) scheme (and the block(s) of data in an embodiment therefore correspond to units of compression, with each block being encoded/decoded separately).

The compression metadata associated with a, and each, block of data may thus include compression parameters, etc., for the block of data indicating how, and whether, the block of data should be decoded (decompressed), e.g. as it is written into the cache.

The associated compression metadata for a block of data that is provided as such side band data can thus be read during a memory read transaction and used to determine whether, and how, to process (decode) the block of data.

Correspondingly, when a block of data (e.g. of a data array) that resides in the cache is to be written out from the cache into memory to be stored in a compressed format, the block of compressed data (i.e. the 'payload') is written into a respective data structure (e.g. region of memory) in the memory system.

For instance, after a block of data has been loaded into the cache from memory, once the block of data has been used, the block of data may subsequently be selected for eviction, and evicted, in order to free up space in the cache for new data. In an embodiment the block of data is compressed as it is written out of the cache to memory and so in embodiments a new set of (updated) compression metadata is generated for the block of data.

The (updated) compression metadata for the block of data, and in an embodiment any other suitable "header" data that may desirably be stored in this way for the block of data, is then stored (e.g. in memory) in a respective, separate header data structure (such that header data, including the compression metadata, for a, and in an embodiment each, block is stored in a separate data structure, e.g. separate region of memory, to the block of data itself (the payload)).

Storing and providing the compression metadata as separate "side band" data may provide various benefits (e.g. as compared to storing the compression metadata together with the payload data, e.g. in a dedicated header block as part of a single data structure), as will be explained further below.

In particular, storing the compression metadata as separate side band data may provide various benefits when the processor is operating to write out (or read in) a plurality of such blocks of data that are arranged together (in memory) as a respective data structure, the data structure, e.g., and in an embodiment, corresponding to a single "page" of physical memory.

Thus, in an embodiment respective sets of plural such blocks are grouped together, and arranged in memory, as a single respective data structure, e.g., and in an embodiment corresponding to a "page" of the memory system, e.g. that is to be written out (or read in) in a single memory transaction.

For instance, in embodiments, the data structure (memory page) in memory into which the plurality of blocks of data are stored comprises a continuous set of (physical) memory addresses. Arranging the data structure in this manner, e.g. with the data structure storing plural data blocks organised in a memory page and, for example, the data structure (e.g. memory page) having a single physical base address, may help, for example, to simplify the physical addressing that needs to be used in relation to the data blocks, etc., in memory.

Thus, whilst embodiments have been described above in relation to a single block of data that is to be written into (or out from) the cache, it will be appreciated that a plurality of blocks of data (e.g. corresponding to a single data structure, e.g. memory page) may be, and in an embodiment are, written into (or out from) the cache together.

Each of the plurality of blocks of data (in the overall data structure, e.g. memory page) is then stored in the same manner as described above. Thus, in the technology described herein, the compression metadata (header data) for a (and each) block of data that is stored in the cache is stored separately from the block of data, and provided as (separate) side band information that is suitably associated with the block(s) of data.

Thus, in embodiments, the technology described herein comprises loading a plurality of compressed blocks of data from the memory system into the cache, each compressed block of data having a respective set of associated compression metadata, with the compression metadata for each block being provided as separate side band data. In this case, each block of data of the plurality of blocks of data is stored into a respective group of one or more cache lines of the cache, and the respective compression metadata for each block is provided as separate side band data associated with a cache line of the group of one or more cache lines of the cache in which the respective block of data is stored.

This means that rather than, e.g., storing the compression metadata (header data) in the cache together with the payload, e.g. in a dedicated header block that contains the associated compression metadata for a plurality of blocks of data (e.g. corresponding to a single memory "page"), the compression metadata (header data) can be, and in an embodiment is, stored and provided separately (in the side band data structure(s)) for each block of data that is stored in the cache.

In this way, by storing the compression metadata for the blocks as separate side band information associated with each block of data (and, more particularly, associated with the group of cache lines in which each block of data is stored), it is possible to further simplify the memory addressing scheme, e.g. since there is no need to leave a space in the data structure (memory page) for storing the compression metadata. This in turn facilitates more regular addressing logic.

Storing the compression metadata in this way may also simplify cache "slice" integration, e.g. where the cache is divided into plural separate physical portions ("slices"), with each slice storing respective data, e.g. for a respective processing core of the processor (and the cache is "sliced" in embodiments of the technology described herein).

For instance, in embodiments, a single physical "page" of memory may be divided into a plurality of blocks of data, with different blocks of data being striped into different cache slices. Each block of data is stored using a group of cache lines which reside in the same cache slice. Because the compression metadata for a given block of data is stored as side band information that is associated with the group of cache lines in which the block of data is stored, the compression metadata is therefore accessible locally to the slice, such that no communication is required across different cache slices (e.g. as may be the case if the compression metadata was stored in the cache, e.g., in a dedicated header block, which header block may reside in a different cache slice to a given block of data).

Furthermore, storing the compression metadata in a separate side band data structure may allow for a better utilisation of the available cache space. For instance, in embodiments, each block of data corresponds (in size) to an integer number of cache lines, with each block of data in an embodiment having the same size, e.g. in order to simplify the addressing. However, the associated compression metadata for a block (or set of blocks within a data structure, e.g. memory page) may typically not fill an entire group of cache lines.

Thus, storing the compression metadata in a dedicated header block in the cache together with the payload may mean that the group of cache lines storing the header block are not fully utilised. In contrast, in the technology described herein, the cache lines can be (more) fully utilised for storing the payload data.

Thus, the technology described herein recognises that storing the compression metadata as separate side band information may facilitate an improved cache operation, e.g. compared to other approaches for storing the associated header data, at least in the context described above.

The side band header data may be stored in separate physical region of the (same) memory as the block(s) of data or the header data may reside in separate memory, e.g. in a dedicated cache for storing such data.

The side band data structure for a block of data is then provided separately along a suitable side channel when a memory transaction requires access to the block of data.

The side band data structure in which the compression metadata is stored/provided may be any suitable side band data structure that can be associated with cache line(s).

In an embodiment, the sideband data structure is a separate data structure, that is stored separately from the cache lines themselves.

For example, and in some embodiments, the compression metadata may be stored in a dedicated portion of memory that is allocated for storing the compression metadata (a physical 'carve out'). The compression metadata can thus be provided from its dedicated portion of memory as an additional sideband signal along with its associated cache line(s), e.g. in the form of a "tag". The compression metadata may also be cached at some point in the data processing system in a suitable compression metadata cache which is, e.g., and in an embodiment, separate from the cache used to store the blocks of data themselves.

In other embodiments, the compression metadata for a cache line may be stored as part of the metadata that is stored with (in) the cache line itself, for example in the cache line tag (or "key") that identifies the data that is stored in the cache line.

For instance, each cache line will generally be associated with appropriate metadata including an identifier (the cache line tag or key) that identifies the data that is stored in the cache line (e.g. in the form of a memory address). The cache line metadata may, e.g., include a plurality of data fields (each comprising a number of bits), and in some embodiments the compression metadata is signalled in the cache line metadata using one such data field, such as part of the cache line tag (key). However, other arrangements for storing/providing would be possible.

In this respect the technology described herein further recognises that there may be existing side band data structures, or data fields in such data structures, that can be (re-)utilised for storing the header information, and in an embodiment this is done.

Thus, in some embodiments, each (compressed) block of data may generally have an associated header data structure including one or more data fields for storing any suitable and desired header data for the block of data. In embodiments, the compression metadata is stored using one or more of such data fields that would in other circumstances be used for signalling other information (but which other information is not required for the technology described herein).

For example, in an embodiment, a memory "tag" that is provided for the purpose of mitigating against memory safety violations is used (repurposed) for storing the compression metadata. For instance, memory locations can be "tagged" by adding a number of bits of metadata (a memory tag) to each region of physical memory (e.g. four bits for each 16 bytes of physical memory).

When such memory tagging is enabled, the memory tag implements lock and key access to the memory location. For instance, a "lock" can be set when writing data to a memory location (a physical memory address), and "keys" provided during memory access. For example, the pointers (and therefore virtual addresses/cache lines) may be suitably modified to include the key. Thus, each cache line may have an associated number of bits for signalling the memory tag. If the key matches the lock, memory access is permitted. If it does not match, an error is reported.

An example use case for such memory tags would be for buffer colouring, e.g. to avoid buffer over/under-runs. However, for use cases where the buffer colouring is not used, the technology described herein recognises that the memory tag bits may be used for signalling associated header data, e.g. for the data stored in that cache line (or in a group of cache lines including that cache line).

Thus, such memory tagging may be selectively enabled. In cases where it is not required (and therefore not enabled), the memory tags (i.e. the bits) will anyway still be transmitted for the cache lines. Thus, embodiments of the technology described herein recognise that these existing memory tag bits may beneficially be repurposed to store the associated header data, e.g. in the manner described above.

The benefit of this is that these data structures (e.g. memory tags) are implicitly available such that there is no need to introduce any additional side band data structures or side channels into the data processing system for storing the compression metadata in the manner of the technology described herein. However, various other arrangements would be possible.

In an embodiment the side band data structure (e.g. memory tag) including the compression metadata for a given block is associated with (and only with) one, and in an embodiment the first, cache line in the group of cache lines storing the block of data. When the block of data is accessed the, e.g. first cache line in the group of cache lines for the block of data, as well as its associated side band data, is thus in an embodiment always read, e.g., to read the compression metadata and determine how, and whether, to process the block of data. This then avoids the need for a separate header lookup, etc.

However, other arrangements would be possible and the compression metadata may be stored in respective side band data structures associated with more than one of, or all of, the cache lines in the group of cache lines. This may be desired, for example, if the compression metadata does not fit into the available bits for a single cache line's memory tag.

It is believed that storing the compression metadata in an existing data field in the manner described above may be novel and advantageous in its own right.

Another embodiment of the technology described herein comprises a method of operating a data processing system, the data processing system comprising:
a processor; and
a memory system;
the method comprising:
when a block of data is to be stored in memory in a compressed form, the compressed block of data having a set of associated compression metadata:
storing the block of data into a respective data structure in memory; and
storing the compression metadata in a separate header data structure, the header data structure including one or more data fields, and wherein the compression metadata is stored in a data field that would in a different mode of operation be used for other information.

A further embodiment of the technology described herein comprises a data processing system comprising:
a processor; and
a memory system; and
a control circuit configured to:
when a block of data is to be stored in memory in a compressed form, the compressed block of data having a set of associated compression metadata:
store the block of data into a respective data structure in memory; and
store the compression metadata in a separate header data structure, the header data structure including one or more data fields, and wherein the compression metadata is stored in a data field that would in a different mode of operation be used for other information.

It will be understood that the technology described herein according to these embodiments may generally comprise any (or all) features described above in relation to the other aspects and embodiments of the technology described herein, at least to the extent they are not mutually exclusive.

For instance, the data processing system in these further embodiments in an embodiment comprises a cache system including a cache that is in an embodiment operated in the manner described above.

Furthermore, the header data structure in these further embodiments may in embodiments comprise a data structure as described above. The data field may in that case, e.g., comprise a data field that is in other circumstances used to store a memory tag, e.g. of the type described above.

Thus, it will be seen that embodiments of the technology described herein relate to improved mechanisms for storing compression metadata, particularly where the compression metadata is stored and provided separately to the payload data (in an embodiment by re-utilising an existing data structure). The data processing system of the technology described herein includes a memory system, a data processor and a cache system.

The memory (memory system) of the data processing system may comprise any suitable and desired memory and memory system of the data processing system, such as, and in an embodiment, a main memory for the particular processor in question (e.g. where there is a separate memory system for the processor), or a main memory of the data processing system that is shared with other elements, such as a host processor (CPU), of the data processing system.

The processor of the data processing system can comprise any suitable and desired processor of the data processing system, such as a CPU (central processing unit), a graphics processor (GPU (graphics processing unit)), a display processor (DPU (display processing unit)), a video processor (VPU (video processing unit)), an image signal processor (ISP), etc. In an embodiment, it comprises a graphics processor (GPU).

The processor should, and in an embodiment does, comprise one or more (and in an embodiment a plurality of) processing cores, which are operable to perform processing operations on data to be processed by the processor.

Correspondingly, the cache system and the cache is in an embodiment configured to provide data to the processing core or cores of the processor for use when performing processing operations and correspondingly to receive data from the processing core or cores of the processor for sending to the memory system.

The data that is transferred using the cache, and the block(s) of data that are to be written into the cache, may be any suitable and desired data and blocks of that data that a data processor may operate on. For example, and in an embodiment, the block of data that is to be written into the cache comprises a block of data of a (larger) array of data that the data processor is processing, the array of data and the block of data (each) comprising an array of data elements each having an associated data value(s).

In the case of a graphics processor, the data array may comprise, for example, and in an embodiment, an image that the graphics processor is processing, and thus the data will comprise appropriate (e.g.) colour values for the data elements (sampling positions) of the data array and that the data array represents. In this case, the data array may comprise, for example, a frame (the frame buffer) that the graphics processor is processing, e.g. for display, and/or data, such as a graphics texture, that is being used or generated by the graphics processor. In other arrangements, the data may comprise geometry data, such as for or of vertices and/or primitives that the graphics processor is processing. Thus, in an embodiment, the data that is stored in the cache and handled in the manner of the technology described herein comprises image data (e.g. a texture or frame) or geometry data (positions and/or attributes).

Thus, in an embodiment, the array of data that is to be stored in the memory and the block of data handled in the manner of the technology described herein comprises image data (e.g. a texture or frame) or geometry data (positions and/or attributes). Thus, in an embodiment the block of data that is (to be) stored in the cache, and for which the associated header data is stored in the manner described above, comprises a block (e.g. tile) of image or geometry data that represents a particular region of the frame of image data.

The data (e.g. graphics) processing operation that the (e.g. graphics) processor is performing using the array of data can correspondingly be any suitable and desired (e.g. graphics) processing operation that a (e.g. graphics) processor can perform. Thus it may, for example, be an appropriate graphics geometry processing operation, or a fragment (pixel) shading operation, etc. In an embodiment, the processing operation is a graphics shading operation, such as a geometry shading, vertex shading, or fragment shading operation. The operation could also be a compute shading operation, where the (e.g. graphics) processor is performing compute shading operations.

The block of data (that is written to the data structure and for which the header data is stored) may represent any suitable and desired region of the array of data. For example, the block of data may represent the whole of the array of data (e.g. only a single block of data may be written out for the whole of the array of data).

However, in one embodiment the block of data represents a portion (less than the whole) of the array of data. In an embodiment the array of data comprises a plurality of blocks of data. In an embodiment the plurality of blocks of data represent a respective plurality of regions (areas) of the array of data.

Thus, in an embodiment, the method is performed (and the processor is configured to, inter alia, write out the block of data and store the associated header data in a respective side band data structure) for (e.g. each of) a plurality of blocks (making up some or all of the overall data array). As discussed below, there are a number of different ways in which this may be implemented.

In an embodiment the array of data comprises an array of data of a stream of arrays of data (e.g. a stream of frames of image data) that are to be processed in the manner of the technology described herein. Thus, in an embodiment, the method is performed (and the processor is configured to, inter alia, write out the block(s) of data and store the associated header) for (e.g. each of) a plurality of arrays of data of a stream of arrays of data.

When the array of data is to be represented by a plurality of blocks of data, in an embodiment the method comprises (and the processor is configured to) dividing the array of data into a plurality of blocks of data. Each of the plurality of blocks of data may then be processed according to the method of the technology described herein.

The blocks of data that the array of data is divided into may each represent any suitable and desired region (area, e.g. tile) of the array of data (e.g. a frame of image data) that the processor is able to operate on. Each block of data in an embodiment represents a different region of the overall array of data (although the blocks could overlap if desired). Each block should represent an appropriate region (area) of the array of data, such as a plurality of data positions within the array (e.g. pixels of image data).

The block(s) of data of the array of data are in an embodiment rectangular in shape, e.g. square. The rectangular blocks may take any suitable and desired size. In an embodiment the rectangular blocks each have a size between and including 4×4 data elements (sampling positions, e.g. pixels) and 64×64 data elements, in an embodiment with each edge of the rectangular blocks having a size of 2n data elements, where n is an integer (e.g. between and including 2 and 6). For example, a block may correspond to a (e.g. 16×16 sampling position) rendering tile, e.g. of a frame of image data. Other arrangements and sizes would of course be possible.

As mentioned above, in embodiments, a plurality of such blocks of data are arranged together as part of a single data structure, e.g., and in an embodiment, corresponding to a single "page" of memory.

Each block of data in the data structure in an embodiment has the same, particular (e.g. predefined) size. In an embodiment, the size of each data block is based on, and corresponds to, the amount of data that can be handled in respective memory transactions (bursts) in the processing system. Thus, in an embodiment, each data block in its uncompressed form corresponds to an integer number of cache lines, such as, and in an embodiment, four cache lines.

In one embodiment the data structure comprises a single (e.g. 4 kB) page of memory (e.g. comprising a set of continuous memory addresses). The (e.g. 4 kB) page of memory may be arranged in any suitable and desired way. In one embodiment the data structure (e.g. the page of memory) comprises 16 (e.g. 256 B) regions for storing "payload" blocks of data of the array of data (for (e.g.

graphics) processing operations). In the technology described herein, each region (block of data) has associated ("side band") header information stored in a respective, separate data structure.

A given array of data (e.g. representing an image, or a region of an image) may, for example, then be divided into and stored as one or more (e.g. a plurality of) such pages (e.g. of size 4 kB) in the memory, e.g. as a buffer. Other sizes of memory pages and blocks would, of course, be possible.

In the technology described herein the block(s) of data is written to (and stored in) memory in an encoded (e.g. compressed) format, in an embodiment using a block-based encoding (compression) scheme.

Thus, as mentioned above, the block(s) of data in an embodiment correspond to units of compression, with each block therefore being encoded/decoded separately. In this case, a (and each) block (when uncompressed) in an embodiment corresponds to an integer number of cache lines of the cache the read request is made to, e.g. 4 or 8 cache lines. (Thus, in the case of 64 byte cache lines, each data block in its uncompressed form may, e.g., comprise and be stored as a 256 or 512 byte block of data.)

The encoding of the block(s) of data may be performed by any suitable and desired element (e.g. processing unit) of or associated with the processor. For example, the encoding may be performed by a shader core of the (e.g. graphics) processor or by an (e.g. external) encoder associated with the processor or memory.

However, in an embodiment, the encoding is performed by a data encoder associated with the cache, as will be explained further below. In an embodiment, data is thus stored in the cache in unencoded (e.g. uncompressed) format, and encoded (compressed) as it is written from the cache to memory. Correspondingly, data is decoded (decompressed) as it written from memory into the cache.

Thus, the cache system in an embodiment also includes a data encoder associated with the cache. The data encoder is in an embodiment arranged to encode (compress) uncompressed data from the cache, when this data is to be written from the cache to the memory system, and to send the compressed data to the memory system for storing. The data encoder is in an embodiment also arranged to decode (decompress) compressed data from the memory system, when this data is to be read (retrieved) from the memory system (and written) into the cache, for storing in the cache in an uncompressed format. Thus the encoder in an embodiment reads in and stores data from the memory system in the cache an uncompressed form, and returns data to the memory system in a compressed form.

It will be appreciated that by providing and associating (e.g. integrating) a data encoder/decoder with the cache, this allows the compression (encoding) and decompression (decoding) of data (as appropriate) that is to be transferred between the graphics processor and the memory system (and stored, e.g. temporarily, in the cache while being used by the graphics processor), to be performed by the cache system itself. This helps to facilitate the graphics processing system to be used with newer APIs (application programming interfaces) such as Vulkan, while maintaining appropriate synchronisation of the compressed data stored in the memory system.

The one or more blocks of the array of data may be encoded (compressed) using any suitable and desired encoding (compression) technique. In one set of embodiments the method comprises (and the processor is configured to) encoding the one or more blocks of the array of data using the frame buffer compression techniques described in the Applicant's U.S. Pat. No. 8,542,939 B2, U.S. Pat. No. 9,014,496 B2, U.S. Pat. No. 8,990,518 B2 and U.S. Pat. No. 9,116,790 B2. In one set of embodiments the method comprises (and the processor is configured to) also or instead (and in an embodiment also) encoding the one or more blocks of the array of data using a fixed rate compression technique.

Thus the data encoder may be configured to perform any suitable and desired encoding (e.g. compression) and decoding (e.g. decompression) operation(s), e.g. in dependence on the compression format(s) that may be used for the data.

The data encoder therefore should, and does in an embodiment, comprise an appropriate codec (data coder/decoder) or codecs operable to and configured to encode (compress) data to be written from the cache to the memory system and to decode (decompress) data to be read from the memory system into the cache.

As mentioned above, the compressed data blocks have associated compression metadata, which is in an embodiment stored as part of a side band header data structure for the data block.

Thus the compression metadata for a given data block may, and in an embodiment does, comprise, one or more of, and in an embodiment all of: an indication of whether the data block is stored in the memory in a compressed format or not; any required compression parameters/state, such as an indication of the compression format that has been used for the data block; and an indication of the number of memory transactions (bursts) that will be needed to read the (compressed) data from the memory for the data block in question (this may be appropriate where a variable rate compression scheme is being used, so it is desirable to indicate how much data needs to be fetched from the memory for each individual data block).

In addition to the compression metadata, any other suitable and desired data that may be appropriate for a data block may be stored as header data in the side band header data structure for the data block.

For example, the header data for a block of data may also include, inter alia, a respective content-indicating signature for the block, e.g., and in an embodiment, in the form of a cyclic redundancy check (CRC).

It will be appreciated from the above that embodiments of the technology described herein may therefore provide improved cache operations, e.g., and in an embodiment, be simplifying the physical addressing that needs to be used in relation to the data blocks, etc., in memory.

The cache system can be any suitable and desired cache system that is operable to and configured to hold data between a processor (the processing core or cores of a processor) and a memory system. Thus it may, for example, be a system cache that is shared between plural processors, or a cache for a particular processor.

The cache system may comprise a single cache "level", in which case it will be that cache level that operates in the manner of the technology described herein.

In embodiments, the cache system comprises multiple cache levels (a cache hierarchy), such as L1 and L2 caches. In this case, the cache that operates in the manner of the technology described herein is the cache level is one level of the cache system, and in an embodiment is the cache level that is closer to the graphics processor (the processing cores of the graphics processor) and in an embodiment the cache level from which data is provided to and received from the processing cores of the graphics processor of the cache hierarchy, such as, and in an embodiment, the L2 cache.

Thus, in an embodiment, the cache that is configured to receive data from the memory system to provide data to the graphics processor for use when performing graphics processing operations and to receive data from the graphics processor for sending to the memory system and that is operated in the manner of the technology described herein is the L2 cache of the cache system.

Correspondingly, the data encoder associated with the cache (where this is provided) is in an embodiment between the L2 cache of the graphics processor and the (external) memory system, and in an embodiment integrated into the L2 cache system of the graphics processor.

It will be appreciated in this regard that where the cache system includes multiple cache levels, with only one of which cache levels, e.g. the L2 cache, operating in the manner of the technology described herein, then the writing of data from the cache to the memory system and the reading of data from the memory system into the cache (that operates in the manner of the technology described herein) may comprise writing that data to and reading that data from a cache level that is closer to the memory system, as appropriate (where the required data can be and/or is already cached in the cache system at a level that is closer to the memory system itself).

In other words, when reading data from the memory system into the cache in the operation of the technology described herein, that data can be read from a cache level that is closer to the memory system and does not necessarily need to be retrieved from the memory system itself if it is already available in a cache that is closer to the memory system. Correspondingly, the operation in the manner of the technology described herein when writing data from the cache to the memory system relates to the operation where the data is written from the cache towards the memory system, but that data could be retained at a higher level in the cache system that is closer to the memory system without reaching the memory system itself.

Thus references to writing data from the cache to the memory system, and reading data in a compressed format from the memory system into the cache refers in general to writing data "towards" the memory system, and reading data into the cache, and therefore encompasses writing data to and/or reading data from a level of the cache system (e.g. the L3 cache) that is closer to the memory system, without necessarily requiring the data to reach the memory system itself or to be fetched from the memory system itself (although the intention will normally be that the data is to reach the memory system or come from the memory system, it will just be that the cache system operation may avoid the need to actually go all the way to the memory system when writing/reading the data).

In the case where the cache system includes multiple cache levels, then the cache system (the multiple cache levels) is in an embodiment configured and arranged to be "coherent" (i.e. such that all copies of the same data in the cache system (across the cache levels) are kept synchronised (are ensured to be the same (i.e. such that when one copy of the data is changed, the other copies within the cache system and the memory system are changed to reflect that change)).

Subject to the particular operation of the technology described herein, the cache system can otherwise operate in any suitable and desired manner, such as, and in an embodiment, in accordance with the normal manner for cache operations in the graphics processing system in question.

For instance, when the graphics processor requires some input data that is presumed to reside in the memory system, a read request for that data is first issued to the cache system, with the read request being passed through the cache and memory hierarchy, i.e. from the graphics processor to the cache system and ultimately to the memory system, as required.

That is, when the requested data is present in the cache of the technology described herein, the data can then be provided to the graphics processor for processing thereby. On the other hand, when the requested data is not present in the cache of the technology described herein, the data must first be fetched into the cache from the memory system (by issuing a memory read request).

In that case, the block(s) of data can then be loaded from memory into the cache, e.g. as described above, with the associated compression metadata provided as separate side band data. The compression metadata can then be read and is in an embodiment then used to process (e.g. decode) the compressed block(s) of data, e.g., so that it can be stored appropriately in uncompressed form in the cache.

The data that has been loaded into the cache is in an embodiment then provided from the cache to the processor for use thereby. Once the block of data has been used, the cache lines may be freed for eviction and the block of data written back to memory (if necessary).

The eviction (write-back) process may in an embodiment comprise checking if any of the data (cache lines) to be read (evicted) have been modified (are "dirty"). If not, then the write-back operation is in an embodiment not performed, and the lines selected for eviction are simply invalidated so as to make them available for reuse. This avoids performing the write-back operation where a copy of the (unmodified) data will already be present in the memory system.

On the other hand, if at least some of the data (one of the cache lines) read by the data encoder for eviction has been modified (is "dirty"), then the data needs to be and should be written back to the memory system, as the data in the cache will be different to the data in the memory system.

The eviction (write-back) process in an embodiment also comprises appropriately updating the compression metadata for the data (e.g. data block) that is written back towards the memory system.

Thus in an embodiment the data is encoded (compressed) appropriately to provide a new compressed version of the block. The new, compressed version of the block is then written back to the appropriate block of the data structure in the memory (to replace the existing version of the block). The compression metadata that is stored for the block should be updated appropriately and the updated compression metadata then written out to its appropriate header data structure. Thus it is in an embodiment updated at least to indicate how many memory transactions are required to fetch the compressed data block that is being written back. It may also be updated to indicate additional compression state that may be needed for subsequent decode (decompress) operations, such as solid colour indications, etc.

Correspondingly, when the graphics processor has data that is to be written to the memory system, the graphics processor will issue a write request to write that data to the cache, and the data will be written to the cache. Data in the cache will then be written back to the memory system when it falls to be evicted from the cache. At the same time, the updated compression metadata is written back to its respective data structure (e.g. in memory).

The cache can be configured in any suitable and desired manner, e.g. in accordance with the normal cache arrangements of the graphics processor and graphics processing system in question.

Thus the cache will in an embodiment comprise a plurality of cache lines, each able to store a respective data entry or entries. Each cache line will also be associated with appropriate (cache) metadata, such as, and in an embodiment, one or more of, and in an embodiment all of: an identifier (a "cache line tag", or key, that is used when performing cache look ups) for the data that is stored in the cache line; a "valid" flag (bit) to indicate that the data in the cache line is valid; a "free" flag (bit) to indicate that the cache line is available for allocation for storing data; and a "dirty" flag (bit) to indicate that the data in the cache line has been modified since it was written from the memory to the cache line. As mentioned above, in embodiments, the compression metadata is stored/provided as part of the cache line tag.

There may be a single physical cache, or the cache may be divided into plural separate physical portions ("slices"), with each slice, e.g., storing respective data, e.g. for a respective processing core of the processor.

The cache that the read request is made to may interface with the processor (the processing cores of the processor) so as to be able to transfer data therebetween in any suitable and desired manner. In an embodiment, there is an appropriate interconnect, such as an asynchronous switch network (ASN), that interfaces between the cache (e.g. the L2 cache) and the processor (the processing core(s) of the processor).

As will be appreciated from the above, the technology described herein is, in an embodiment, implemented in a graphics processing system comprising a memory system, a cache system, and a graphics processor (a graphics processing unit (GPU)). Data for performing graphics processing operations (e.g. to generate a render output (e.g. image to be displayed)) is stored in a memory of the memory system. The graphics processor is arranged to trigger the fetching of required data from the memory and its storing in the cache system. The graphics processor then reads required data from the cache system for performing graphics processing operations (e.g. generating the render output). The output from the graphics processing operations (e.g. the render output), once generated in this way, is then written back to the memory system via the cache system, and, in an embodiment, displayed, e.g. on a display of an electronic device, such as a phone, tablet, television, computer screen or the like.

The graphics processor (graphics processing unit) may, and in an embodiment does, implement and execute a graphics processing pipeline to perform graphics processing operations.

The graphics processing pipeline may include, and in an embodiment does include, any one or more, and in an embodiment all, of the processing stages that a graphics processing pipeline may normally include, such as, and in an embodiment, a primitive setup stage, a rasteriser, a renderer (in an embodiment in the form of or including a programmable fragment shader (a shader core)).

In an embodiment, the graphics processor (processing pipeline) also comprises one or more programmable shading stages, such as one or more of, and in an embodiment all of, a vertex shading stage, a hull shader, a tessellation stage (e.g. where tessellation is performed by executing a shader program), a domain (evaluation) shading stage (shader), a geometry shading stage (shader), and a fragment shader.

The graphics processor (processing pipeline) may also contain any other suitable and desired processing stages that a graphics processing pipeline may contain such as a depth (or depth and stencil) tester(s), a blender, a tile buffer or buffers, a write out unit etc.

In an embodiment, the graphics processing system includes a host processor that executes applications that may require graphics processing by the graphics processor. In an embodiment the system further includes appropriate storage (e.g. memory), caches, etc., as described above.

In an embodiment, the various functions of the technology described herein are carried out on a single processing platform.

In an embodiment, the data processing system and/or processor also comprises, and/or is in communication with, one or more memories and/or memory devices that store the data described herein, and/or that store software for performing the processes described herein. The data processing system and/or processor may also be in communication with a host microprocessor, and/or with a display for displaying images based on the data generated by the processor (processing pipeline).

The technology described herein may be implemented in any suitable system, such as a suitably configured microprocessor based system. In some embodiments, the technology described herein is implemented in computer and/or micro-processor based system.

The various functions of the technology described herein may be carried out in any desired and suitable manner. For example, the functions of the technology described herein may be implemented in hardware or software, as desired. Thus, for example, the various functional elements and stages of the technology described herein may comprise a suitable processor or processors, controller or controllers, functional units, circuits/circuitry, processing logic, microprocessor arrangements, etc., that are operable to perform the various functions, etc., such as appropriately dedicated hardware elements (processing circuits/circuitry) and/or programmable hardware elements (processing circuits/circuitry) that can be programmed to operate in the desired manner.

It should also be noted here that, as will be appreciated by those skilled in the art, the various functions, etc., of the technology described herein may be duplicated and/or carried out in parallel on a given processor. Equally, the various processing stages may share processing circuits/circuitry, etc., when desired.

Furthermore, any one or more or all of the processing stages of the technology described herein may be embodied as processing stage circuits/circuitry, e.g., in the form of one or more fixed-function units (hardware) (processing circuits/circuitry), and/or in the form of programmable processing circuits/circuitry that may be programmed to perform the desired operation. Equally, any one or more of the processing stages and processing stage circuits/circuitry of the technology described herein may be provided as a separate circuit element to any one or more of the other processing stages or processing stage circuits/circuitry, and/or any one or more or all of the processing stages and processing stage circuits/circuitry may be at least partially formed of shared processing circuits/circuitry.

It will also be appreciated by those skilled in the art that all of the described embodiments of the technology described herein can include, as appropriate, any one or more or all of the features described herein.

The methods in accordance with the technology described herein may be implemented at least partially using software e.g. computer programs. It will thus be seen that when viewed from further embodiments the technology described herein provides computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system. The data processing system may be a microprocessor, a programmable FPGA (Field Programmable Gate Array), etc.

The technology described herein also extends to a computer software carrier comprising such software which when used to operate a graphics processor, renderer or other system comprising a data processor causes in conjunction with said data processor said processor, renderer or system to carry out the steps of the methods of the technology described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the technology described herein need be carried out by computer software and thus from a further broad embodiment the technology described herein provides computer software and such software installed on a computer software carrier for carrying out at least one of the steps of the methods set out herein.

The technology described herein may accordingly suitably be embodied as a computer program product for use with a computer system. Such an implementation may comprise a series of computer readable instructions fixed on a tangible, non-transitory medium, such as a computer readable medium, for example, diskette, CD ROM, ROM, RAM, flash memory, or hard disk. It could also comprise a series of computer readable instructions transmittable to a computer system, via a modem or other interface device, over a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, pre-loaded with a computer system, for example, on a system ROM or fixed disk, or distributed from a server or electronic bulletin board over a network, for example, the Internet or World Wide Web.

A number of embodiments of the technology described herein will now be described in the context of a graphics processing system.

FIG. 1 shows an exemplary graphics processing system in which the technology described herein and the present embodiments may be implemented.

The exemplary graphics processing system shown in FIG. 1 comprises a host processor comprising a central processing unit (CPU) 1, a graphics processor (graphics processing unit (GPU)) 10, a video codec 2, a display controller 3, and a memory controller 4. As shown in FIG. 1, these units communicate via an interconnect 5 and have access to an off-chip memory system (memory) 6. In this system, the GPU 10, the video codec 2 and/or CPU 1 will generate frames (images) to be displayed and the display controller 3 will then provide frames to a display 7 for display.

In use of this system, an application 8, such as a game, executing on the host processor (CPU) 1 will, for example, require the display of frames on the display 7. To do this the application 8 will send appropriate commands and data to a driver 9 for the graphics processing unit 10 that is executing on the CPU 1. The driver 9 will then generate appropriate commands and data to cause the graphics processing unit 10 to render appropriate frames for display and store those frames in appropriate frame buffers, e.g. in main memory 6. The display controller 3 will then read those frames into a buffer for the display from where they are then read out and displayed on the display panel of the display 7.

As part of this processing, the graphics processor 10 will read in data, such as textures, geometry to be rendered, etc. from the memory 6, process that data, and then return data to the memory 6 (e.g. in the form of processed textures and/or frames to be displayed), which data will then further, e.g. as discussed above, be read from the memory, e.g. by the display controller 3, for display on the display 7. Thus there will need to be transfer of data to and from the graphics processor 10 (in particular to and from the processing cores of the graphics processor 10) and the memory 6.

In order to facilitate this, and to reduce the amount of data that needs to be transferred to and from memory during graphics processing operations, the data may be stored in a compressed form in the memory.

As the graphics processor 10 needs to operate on the data in an uncompressed form (and will produce data in an uncompressed form), this accordingly means that data that is stored in the memory in a compressed form will firstly need to be decompressed before being processed by the graphics processor. Correspondingly, data produced by the graphics processor 10 will first need to be compressed before being (finally) stored in the memory 6.

The present embodiments relate in particular to improved techniques for performing such compression and decompression of data between the memory 6 and the graphics processor 10.

Figure 2:
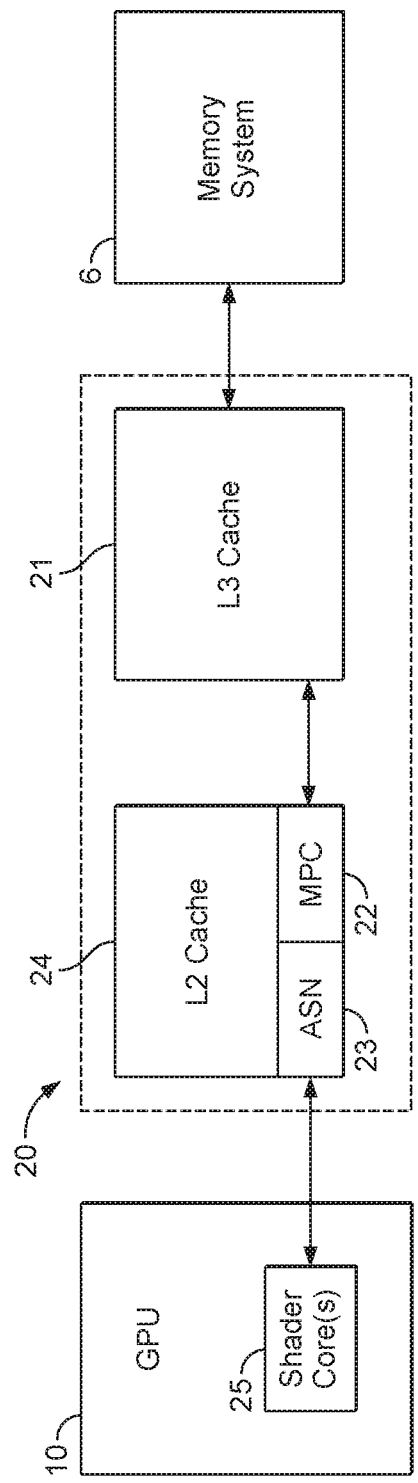
FIG. 2 shows schematically an embodiment of the technology described herein.

FIG. 2 shows schematically and in more detail the elements of the graphics processing system that are relevant to the operation of the present embodiments, and in particular to the transferring of data to and from the memory system 6 and the graphics processor 10 in a compressed form. As will be appreciated by those skilled in the art there may be other elements of the system, etc., that are not shown in FIG. 2.

FIG. 2 shows the memory system 6 and the graphics processor 10. As shown in FIG. 2, in between the memory system 6 and the graphics processor 10, there is a cache system 20 that is operable to transfer data from the memory system 6 to the graphics processor 10 (and in particular to the processing cores (shader cores) 25 of the graphics processor 10), and conversely to transfer data produced by the processing cores 25 of the graphics processor 10 back to the memory 6.

The cache system shown in FIG. 2, is illustrated as comprising two cache levels, an L3 cache 21 that is closer to the memory 6, and an L2 cache 24 that is closer to the graphics processor 10 (and from which the data is provided to the shader cores 25). Other cache hierarchy arrangements would be possible, such as comprising only a single cache level (the L2 cache), or more than two cache levels, if desired.

As shown in FIG. 2, in this embodiment data is transferred from the memory system 6 to the L3 cache 21, then from the L3 cache 21 to the L2 cache 24, and from the L2 cache 24 to the shader cores 25 (and vice versa).

In order to facilitate the handling of compressed data from the memory system 6 (and for returning compressed data to the memory system 6) where that is required, as shown in FIG. 2, the L2 cache 24 has associated with it a data encoder 22 (in the form of a memory page compression unit (MPC)).

As will be discussed further below, this data encoder is operable to decompress data received from the memory system 6 via the L3 cache 21 before storing that data in an uncompressed form in the L2 cache 24 for use by the shader cores 25 of the graphics processor, and, conversely, to compress data that is to be evicted from the L2 cache 24 prior to writing that data back to the memory system 6 (again via the L3 cache 21). The operation of this data encoder (MPC) 22 will be discussed in more detail below.

The L2 cache 24 also includes, as shown in FIG. 2, an appropriate interconnect 23 (in this case in the form of an asynchronous switch network) for transferring data between the L2 cache 24 and the shader cores 25.

In order to facilitate operation between the L2 cache and the data encoder (MPC) 22, each cache line in the L2 cache has associated with it appropriate flags and data to indicate whether the cache line should be handled by the data encoder (MPC) 22 or not.

Figure 3:
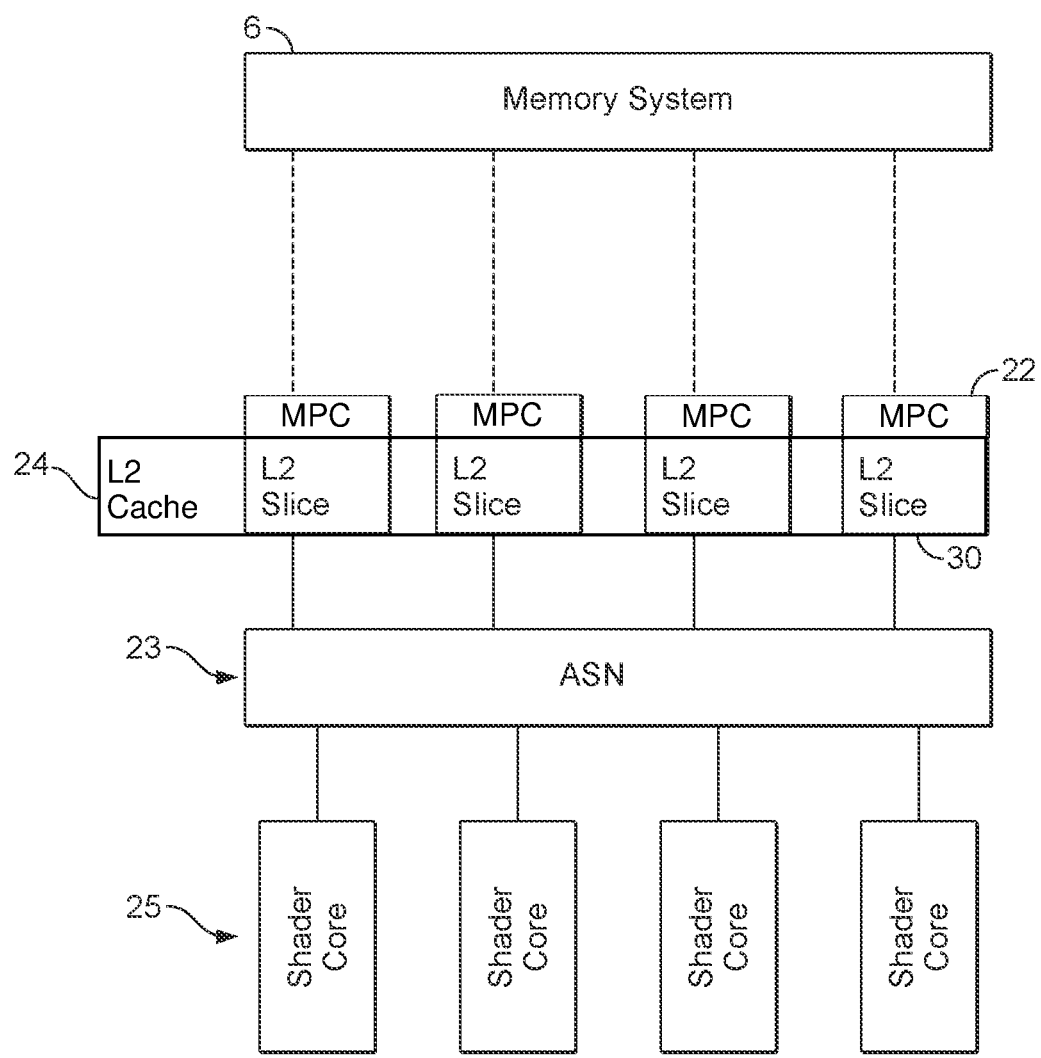
FIG. 3 shows an embodiment of the cache system of the graphics processing system of FIG. 2 in more detail.
Figure 4:
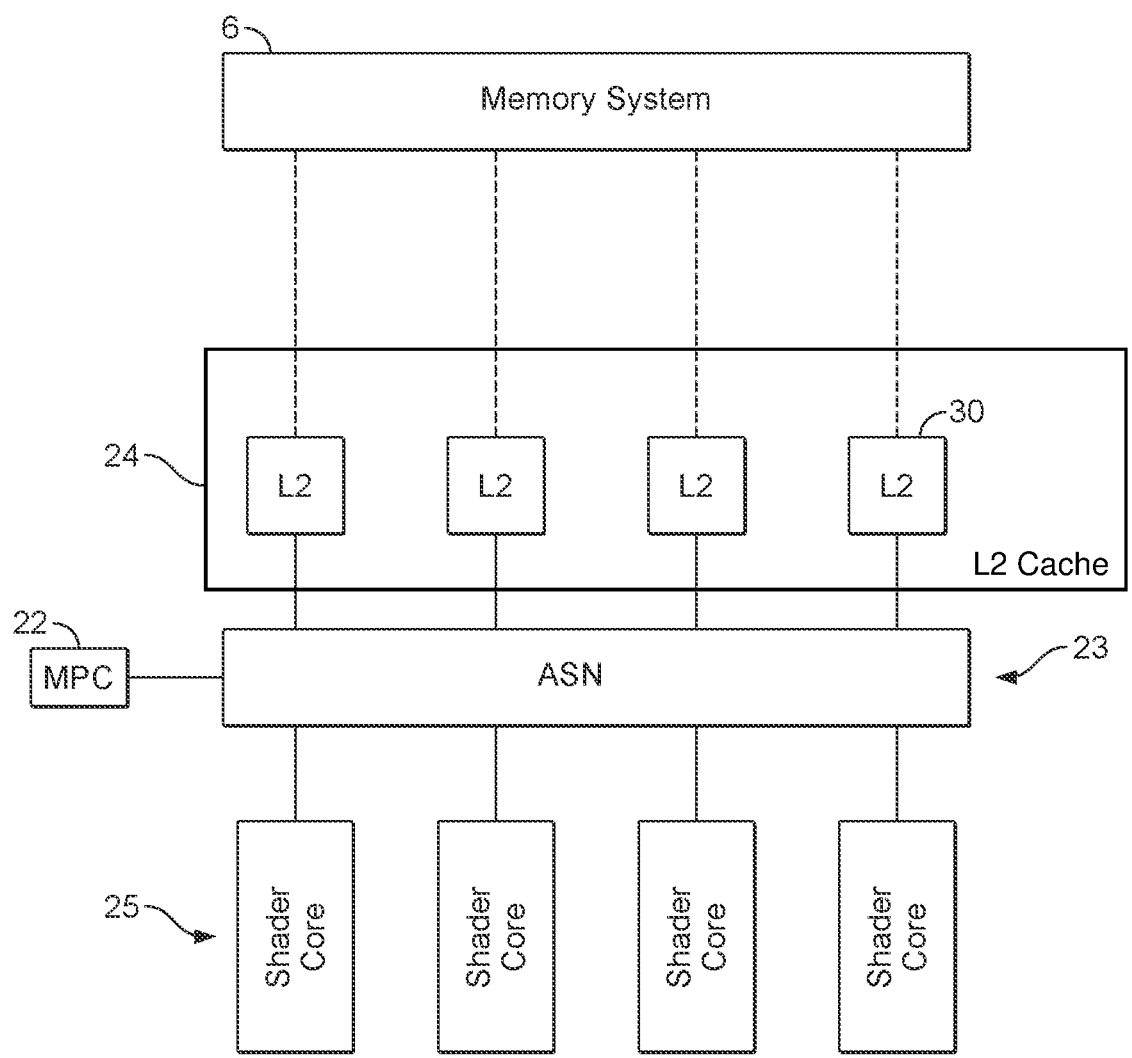
FIG. 4 shows another embodiment of the cache system of the graphics processing system of FIG. 2 in more detail.

FIGS. 3 and 4 show the arrangement of the L2 cache 24, data encoder (memory page compression unit) 22, and shader cores 25 in two possible implementation arrangements of the present embodiments in more detail.

In both FIGS. 3 and 4, the L2 cache 24 is shown as being configured as respective separate physical cache portions (slices) 30. In the arrangement in FIG. 3, each respective L2 slice has its own associated data encoder 22. In the arrangement shown in FIG. 4, rather than each L2 cache slice 30 having its own associated data encoder 22, there is a single data encoder 23 that operates for all the L2 cache slices 30 that is instead coupled to and associated with the interconnect 23 that acts between the L2 cache 24 and the shader cores 25 of the graphics processor.

Figure 5:
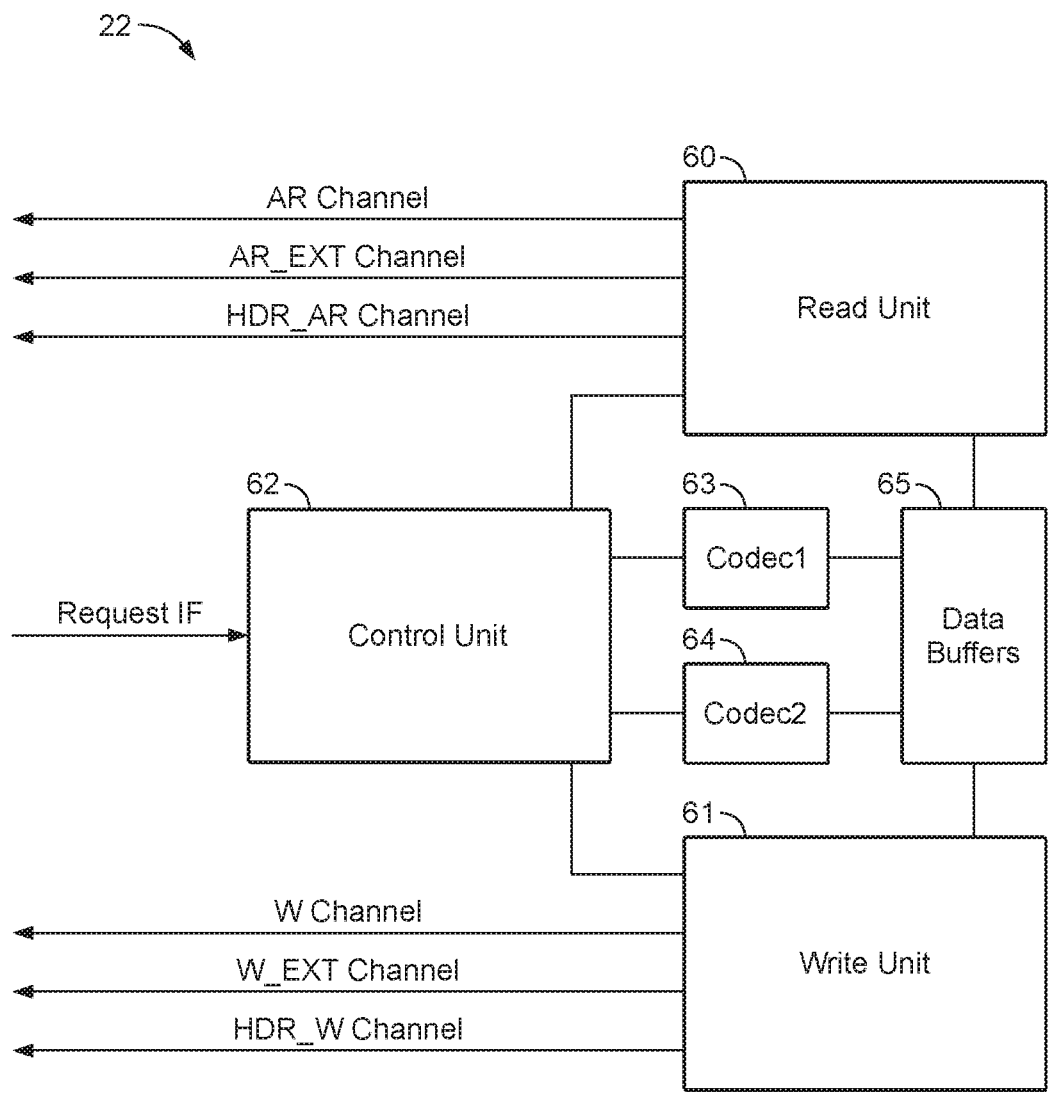
FIG. 5 shows an embodiment of the data encoder in more detail.

FIG. 5 shows an embodiment of the data encoder (memory page compression unit) 22 in the present embodiments. As shown in FIG. 5, the (and each) data encoder includes respective read 60 and write 61 units (circuits) that are operable to, respectively, read data from the L2 cache and the memory system, and write data to the L2 cache and to the memory system. The data encoder 22 also includes an appropriate control unit (circuit) 62 that receives read and write requests from the shader cores and the L2 cache controller and controls the data encoder 22 to respond to those requests accordingly and appropriately.

As shown in FIG. 5, the data encoder 22 also includes one or more codecs 63, 64 and a set of data buffers 65 for temporarily storing data in the data encoder 22 while that data is processed and/or while waiting to write that data to the L2 cache or the memory system.

The data encoder 22 can include any desired number of codecs, e.g. that are each respectively operable to perform a different encoding (compression) scheme. For example, one codec may be configured to perform an appropriate variable rate compression scheme, with the other codec being configured to perform an alternative, e.g. fixed rate compression scheme. Other arrangements would, of course, be possible.

In the present embodiments, the data (e.g. data arrays) that are being processed by the graphics processor are stored as respective blocks of data (blocks of the data array) in the memory 6, with each data block being stored in the memory 6 in a compressed form, but being stored in the L2 cache 24 in an uncompressed form for use by the shader cores 25 of the graphics processor 10.

To facilitate this operation, in the present embodiments the data arrays are stored and organised in memory as respective sets of plural blocks of data, each corresponding to a single memory "page".

Figure 6:
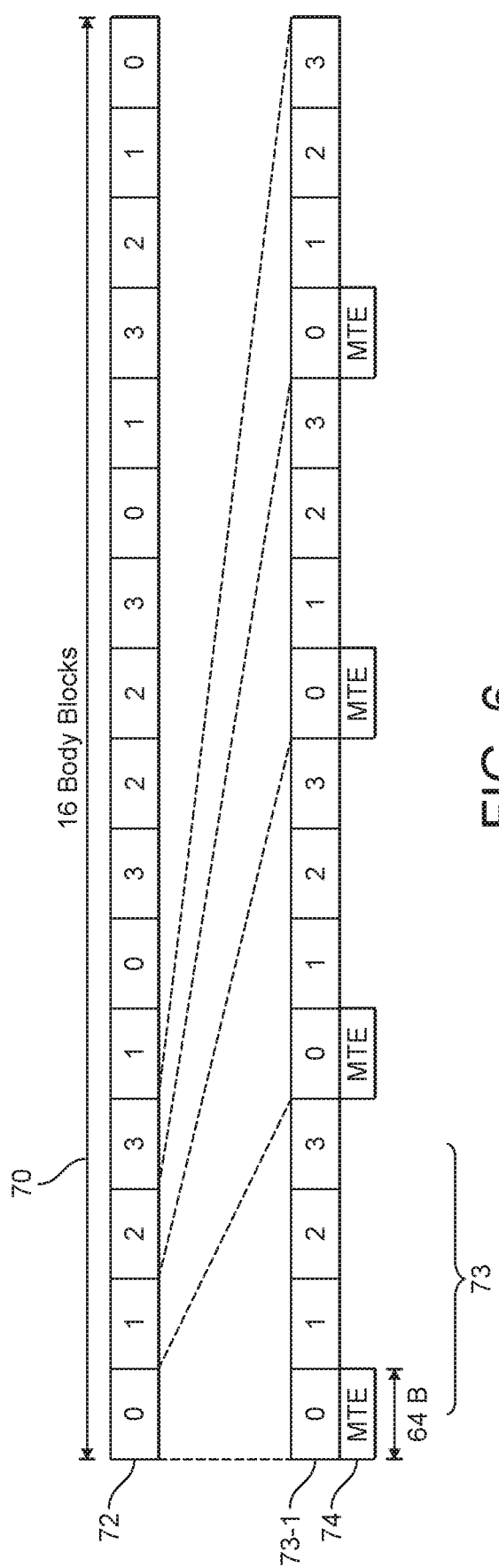
FIG. 6 shows the arrangement of data used in embodiments of the technology described herein.

FIG. 6 illustrates this, and shows a set 70 of sixteen data blocks 72 that will be stored together as a single memory "page".

In FIG. 6, each data block 72 is stored in the cache (in uncompressed form) using a group of four cache lines 73. In the present embodiment, the header data, i.e. the compression metadata, associated with each of the data blocks 72 is stored in a respective side band data structure in the form of a memory "tag" (MTE) 74 associated with the first cache line 73-1 in the group of cache lines 73 in which the data block 72 is stored.

The memory tag comprises a number of bits (e.g. four bits per 16 bytes, so 16 bits for a 64 byte cache line). Such memory tags may be provided, e.g., for the purpose of mitigating memory safety violations. However, in the present embodiments, the memory tagging is disabled, and the bits are repurposed for storing the compression metadata.

Thus, as shown in FIG. 6, the compression metadata (header data) is locally associated with each data block 72. This helps facilitate cache integration. For example, in FIG. 6, each group of cache lines 73 may be stored in a separate cache "slice".

This also means that all of the cache lines can be fully utilised for storing the payload data (and the size of the memory page, and data blocks into which the memory page is divided may be selected such that this is the case).

The respective memory tag 74 for a data block 72 may include any suitable and desired header data that is to be stored for the data block 72. This may comprise, for example, an indication for each respective data block of: whether that data block is stored in a compressed form (and (some) compression state needed for decoding (decompressing) the block (if desired)), and/or of how many memory transactions (bursts) will be needed to fetch the data for that block from the memory (in its compressed form). (This latter may be desirable because although each data block is configured to occupy an integer number cache lines in its uncompressed form, when compressed, particularly if using a variable rate compression scheme, the data may compress to a different (and smaller) number of cache lines (and thus corresponding memory transactions), and that may differ from block-to-block. Thus it is useful if the header block indicates how many memory transactions are needed to fetch the complete set of compressed data for a (and each) data block from the memory.)

In the present embodiment, in order to further facilitate operation in the manner of the technology described herein, each data block 72 corresponds in its uncompressed form to an integer number of, in this case four, cache lines of the L2 cache 24, such that in the case where each cache line comprises 64 bytes, each separate data block will comprise 256 bytes.

The sixteen data blocks accordingly comprise a 4 kilobyte memory page (and will be stored in and fit in the same memory page). This then facilitates addressing of the data blocks, as they will all use the same single, physical memory address.

Other configurations that achieve this kind of arrangement could be used if desired, e.g. depending upon the relative cache line and memory page sizes used in the graphics processing system in question.

Figure 7:
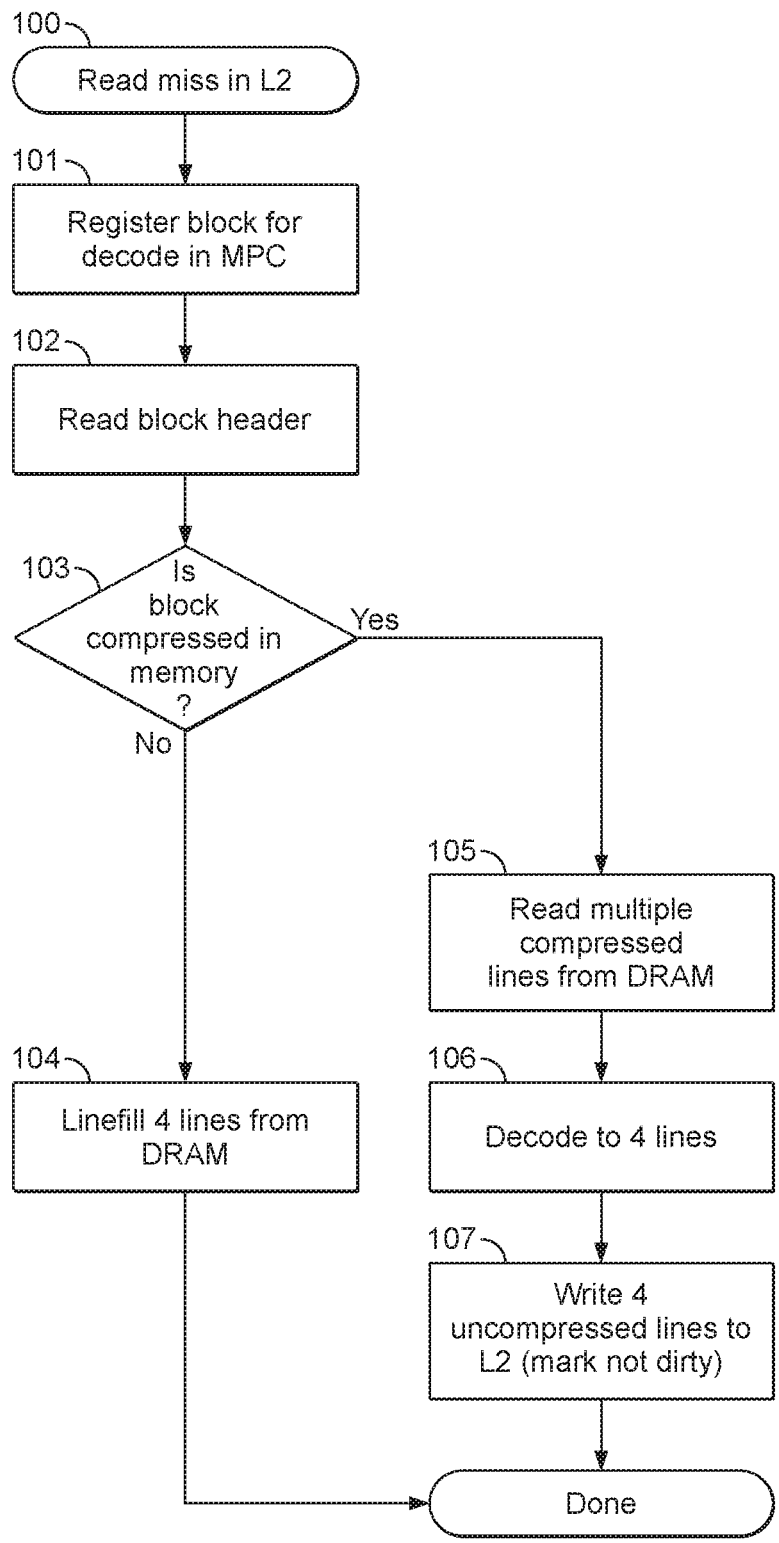
FIG. 7 is a flowchart showing the operation of reading data from the cache in an embodiment of the technology described herein.
Figure 8:
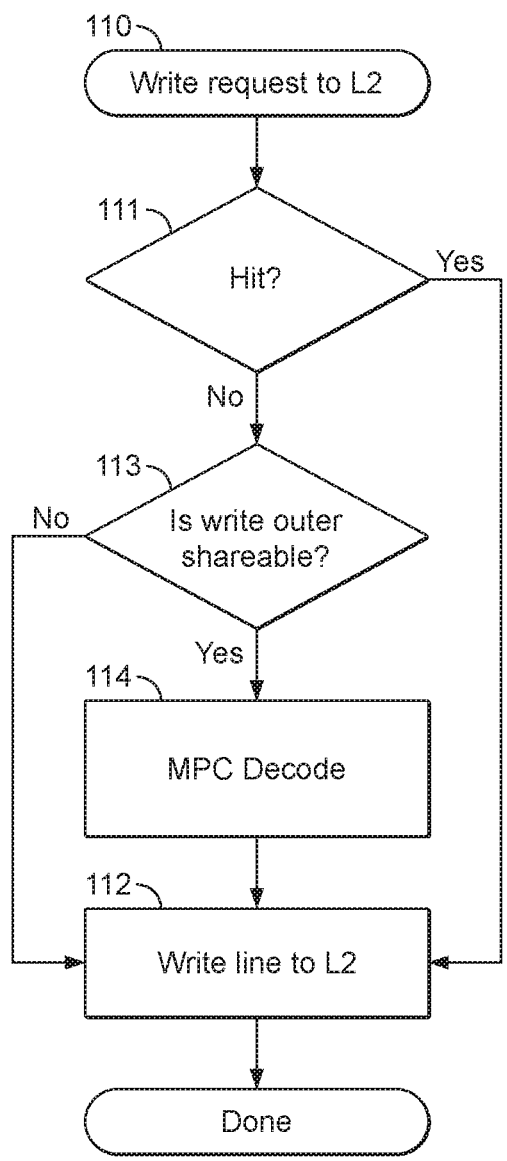
FIG. 8 is a flowchart showing the operation of writing data from the graphics processor to the cache in an embodiment of the technology described herein.
Figure 9:
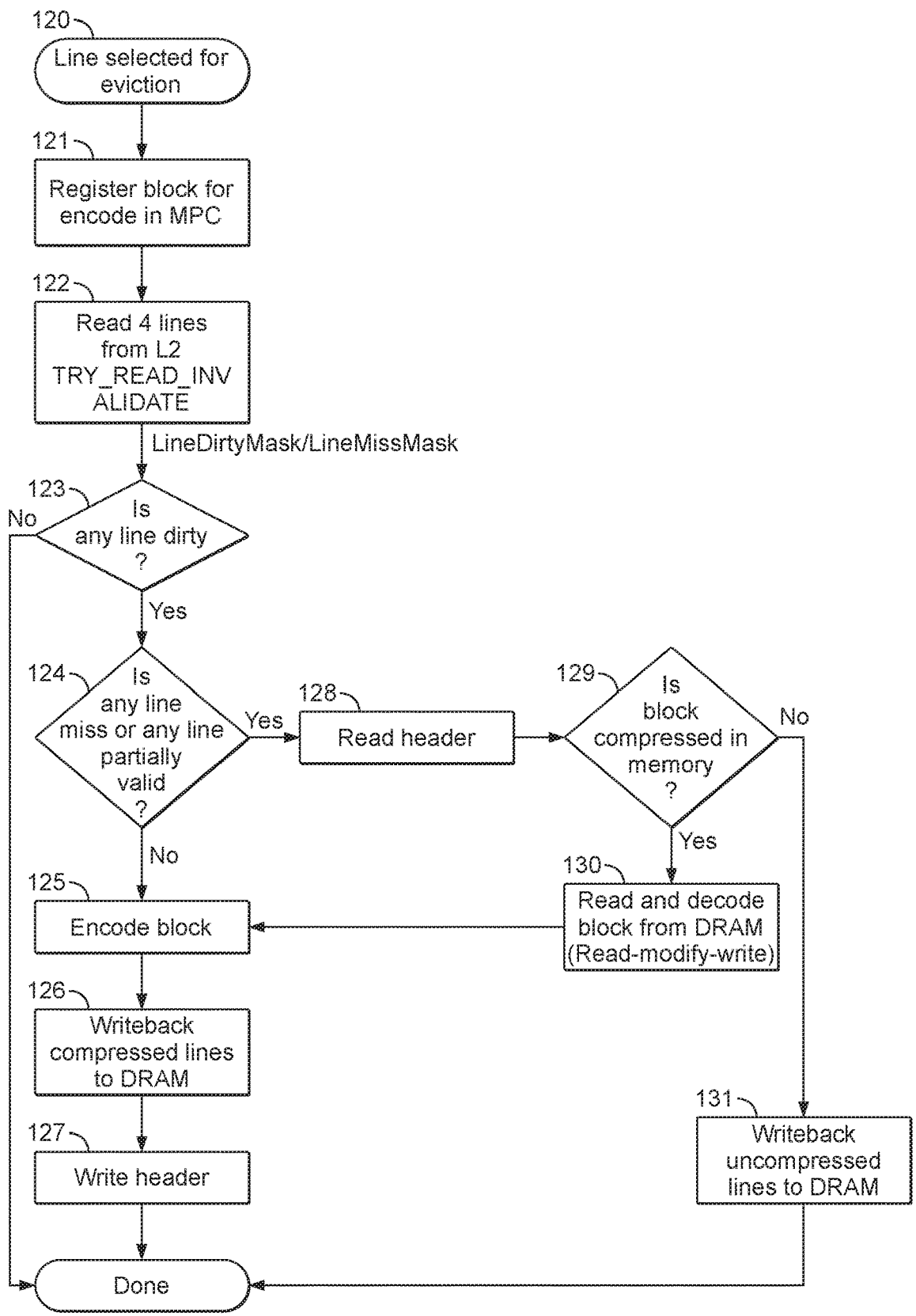
FIG. 9 is a flowchart showing the operation of evicting data from the cache in an embodiment of the technology described herein.

FIGS. 7, 8, and 9 show the operation of the present embodiments when reading data from, writing data to, or evicting data from, the L2 cache 24. FIG. 7 shows the operation when data is being read from the L2 cache 24 for use by a shader core 25 of the graphics processor. FIG. 8 shows the operation when writing data from a shader core 25 to the L2 cache 24. FIG. 9 shows an embodiment for evicting data from the L2 cache 24 back to the main memory system 6.

FIG. 7 shows the operation when data is being read from the L2 cache 24 for use by a shader core 25 of the graphics processor.

When a shader core 25 needs data for a processing operation that it is to perform, it will attempt to read that data from the L2 cache 24, by issuing a read request to the L2 cache.

If the data is present in the L2 cache (i.e. there is "hit" in the L2 cache), then the shader core can read that data from the L2 cache in the normal manner and process that data accordingly.

However, if the data is not present in the L2 cache (i.e. there is a read "miss" in the L2 cache), then the data needs to be fetched from the memory system 6 into the L2 cache 24 for use by the shader core 25 of the graphics processor 10.

In this case, the L2 cache (the controller for the L2 cache) will first determine whether the data that needs to be fetched from the memory system into the cache for use by the shader core is indicated as to be handled by the data encoder 22 or not (as needing processing by the data encoder 22 or not). If not, then the L2 cache controller will request and fetch the data from the memory system 6 into the L2 in the normal manner for the graphics processing and cache system in question.

On the other hand, if the data is indicated as to be processed by the data encoder 22, then the L2 cache (the cache controller) registers the required data for handling by the data encoder 22, for the data encoder 22 to then fetch and process the data and write it into the L2 cache 24 appropriately.

This read miss operation is performed in the present embodiments as shown in FIG. 7.

Thus, as shown in FIG. 7, when there is a read miss in the L2 cache (step 100), and the "missing" data is to be handled by the data encoder 22, the L2 cache 24 (a controller for the L2 cache) notifies (signals) the data encoder 22 that the entire block of data that includes the data that is required (that triggered the read miss) requires fetching and decoding and storing in the L2 cache (step 101).

The data encoder 22 will then first read the header data for the block from its respective side band data structure (i.e. memory tag 74) to be fetched and decoded (step 102), and determine therefrom how many external memory transactions are needed to fetch the compressed data (step 103).

The data encoder 22 then operates to read the appropriate amount of compressed data representing the block from the memory (step 105) (e.g. based on an indication in the header data of how many memory transactions are needed to fetch the complete block). The read compressed data will be stored in the data buffers 65 of the data encoder 22 while it is processed by the data encoder 22 (and before it is written to the L2 cache 24).

The data encoder 22 will then operate to decode the fetched compressed data to thereby provide four lines of uncompressed data (as in the present embodiments each uncompressed data block corresponds to four cache lines worth of data) (step 106), and then write the four uncompressed lines of data to the L2 cache (step 107) (and, if appropriate, mark the so-written lines as not "dirty").

Thus the data encoder 22 will operate to read a compressed data block from the memory 6, together with its associated side band compression metadata (i.e. the memory tag 74), but then decode that data and write the data in the block in an uncompressed form into the L2 cache 24 for use by the graphics processor 10.

It should also be noted here that in this operation as shown in FIG. 7, irrespective of how much data is actually required to be written into the L2 cache from the memory, the data is always written into the L2 cache 24 from the memory 6 as complete blocks. This helps to ensure synchronisation between the memory and the data in the L2 cache.

(As will be appreciated, the operation of loading the data into the L2 cache may comprise first allocating appropriate lines in the L2 cache for the data, and/or evicting lines of data already present in the L2 cache so as to provide available lines for storing the new data block. The cache line allocation, eviction, etc., processes can be performed in any suitable and desired manner, such as in accordance with the normal cache operation in those respects for the graphics processing system in question (subject to the operation in the manner of the technology described herein).)

FIG. 8 shows the operation in the present embodiments where data is to be written to L2 cache 24 from a shader core 25. This may be the case where, for example, a shader core has performed some processing of data from a data array from the memory 6, and now wishes to return the modified data back to the memory system. In this case, the data from the shader core 25 will first be written to the L2 cache 24 and then written therefrom back to the memory system 6 as required.

When writing data from the shader core 25 to the L2 cache 24, the write request from the shader core will be sent to the L2 cache 24.

Thus, as shown in FIG. 8, the write process starts with an appropriate write request from the shader core 25 to the L2 cache (step 110).

It is then determined whether there is already a line (an entry) in the L2 cache for the data that is being written (i.e. whether there is a write "hit" in the L2 cache or not (step 111)).

In the event that there is a hit in the L2 cache 24 for the write request (i.e. a line for the data that is being written already exists in the L2 cache), then the new data from the shader core 25 can simply be written to the appropriate line in the L2 cache accordingly (step 112).

As shown in FIG. 8, on the other hand, in the event of a miss in the L2 cache 24 on a write request, it is then determined whether the data being written could be subject to external reads and snooping in the L2 cache (step 113).

This may be determined, e.g., from an appropriate indication (flag) in the MMU page tables (which indication may, e.g., be propagated with the write transaction to the L2 cache where it will be checked).

The data being written may be flagged as being subjected to external reads and snooping in the L2 cache in the case where the memory page in question is shareable with other components in the system beyond the graphics processor itself, such as a CPU or CPUs, such that the memory page is coherent with other components in the system (and not merely coherent internally within the graphics processor (the graphic processor's L2 cache and lower level caches) only). (In the case where the memory page is coherent beyond the graphics processor itself, then the data may be subjected to external reads and snooping in the L2 cache of the graphics processor from the other components (the cache systems of those other components) in the system for that purpose.)

When it is determined that the data being written is not subject to external reads and snooping in the L2 cache, then the new data can simply be written to the L2 cache (once there is a cache line allocated for that data) (step 112).

On the other hand, when it is determined that the data being written to the L2 cache is to be subject to external reads and snooping of the L2 cache, then rather than simply writing the new data to the L2 cache on its own, the data encoder 22 operates to fetch and decompress the remaining data for the block of data that the new data being written to the L2 cache relates to from the memory system 6 (step 114), and then combines that data retrieved from the memory system with the new data to be written to the L2 cache 24 in order to write a complete block of (uncompressed) data (that includes the new data) to the L2 cache (step 112).

This has the effect of enhancing system coherency, by ensuring that a complete block of data is stored in the L2 cache, even if the write request itself only relates to part of a block of data. This will then avoid, for example, any external snoop transactions for the block of data in question to the L2 cache having to depend on external reads (in addition to the read of the L2 cache) (which may otherwise, e.g., risk deadlocking on the interconnect).

(Again, in the case where there was a miss in the L2 cache on a write request, the write operation will first act to allocate lines in the L2 cache for storing the new data (and, e.g., the complete block of data where appropriate), before that data is written to the L2 cache. The new data to be written to the L2 cache and any other block data retrieved from the memory may be appropriately buffered while processing that data and pending the writing of that data to the L2 cache.)

FIG. 9 shows the operation in the present embodiment where data is to be evicted (written) from the L2 cache 24 back to the memory system 6.

As shown in FIG. 9, this process will start when a line of the L2 cache is selected for eviction (and triggered to be evicted) (step 120).

In this case, the L2 cache (the controller for the L2 cache) will first determine whether the line to be evicted from the L2 cache is indicated to be handled by the data encoder 22 or not (as needing processing by the data encoder 22 or not). If not, then the L2 cache controller will evict the line from the L2 cache to the memory system 6 in the normal manner.

On the other hand, if the cache line (data) is indicated as to be processed by the data encoder 22, then the L2 cache (the cache controller) registers the entire block of data that includes the data (line) that is being evicted for handling by the data encoder 22, for the data encoder 22 to then read those cache lines from the L2 cache, process the block of data and write it back to the memory 6 appropriately (step 121).

The data encoder 22 will then attempt to read all the lines relating to the block in question (so including the line selected for eviction but also any cache lines for the block that have not been selected for eviction) from the L2 cache (step 122). The data read for the cache lines from the L2 cache (where present in the L2 cache) is stored in the data buffers 65 of the data encoder 22, pending processing of that data and the writing of that data back to the memory 6.

As part of this processing, the L2 cache will return to the data encoder 22 an indication of which cache lines that it has attempted to read from the L2 cache are marked as being "dirty" (i.e. have been modified since they were loaded into the cache from the memory), and those lines where the read "missed" in the L2 cache (i.e. those lines for the block in question that are not present in the L2 cache).

Any lines that are read from the L2 cache are also invalidated (marked as being invalid) (so available for re-use). (This is done as soon as the L2 cache read operation is completed, so the lines are available for re-use at that point (and before the eviction procedure in the data encoder 22 has been completed).)

It is then determined whether any of the lines attempted to be read from the L2 cache for the block are marked as dirty (i.e. have been modified since they were fetched into the L2 cache) (step 123).

As shown in FIG. 9, in the case that none of the lines of the L2 cache were "dirty" (i.e. the data has not been modified while it has been present in the L2 cache), then the eviction operation can be terminated without writing the data back to the memory system (as there is no need to write the unmodified data back to the memory system). In this case therefore any data read from the L2 cache will be discarded.

As shown in FIG. 9, on the other hand, in the event that any of the lines read from the cache are "dirty" (i.e. the L2 cache 24 is storing modified data for the data block such that the data for the data block needs to be written back to the memory system 6), then it is determined whether the data encoder 22 encountered a line miss when attempting to read all the lines for the block from the L2 cache, or whether any of the read lines were only partially valid (step 124). Thus the data encoder 22, in effect, determines whether all of the data for the data block in question was present in the L2 cache or not.

In the event that all the data was present in the L2 cache (and so read by the data encoder 22 when it attempted to read that data from the L2 cache), then the data encoder 22 encodes (compresses) the uncompressed data for the block that it has read from the L2 cache (step 125), and then writes the compressed data (the compressed cache lines) back to the memory 6 (step 126).

The data encoder will correspondingly update the header data for each of the data blocks in question, e.g. to indicate the new compression metadata, such as the number of memory transactions needed to fetch the compressed data for the block, etc. (step 127).

In the case where it is determined that not all of the data for the block in question was stored in the L2 cache (i.e. it is determined at step 124 that there was a line miss or an only partially valid line in the L2 cache), then the data encoder 22 reads the header data for the block in question to determine whether the block should be stored in a compressed form in the memory system 6 or not (steps 128 and 129).

If it is determined that the block is not to be stored in a compressed form in memory, then the data encoder simply operates to write the uncompressed lines for the block read from the L2 cache back to the memory system 6 (step 131).

In this case therefore, the data encoder will write the uncompressed data for the block read from the L2 cache back to the memory system, with any data for the block that was not present in the L2 cache simply being left "as is" in the memory system 6.

On the other hand, when it is determined that the block is stored in a compressed form in the memory, then the data encoder 22 operates to read the compressed data for the (entire) block that is stored in the memory and to decode (decompress) that data (step 130) to provide the uncompressed form of the block as stored in the memory. This block data is stored in the data buffers 65 of the data encoder 22.

This thereby provides to the data encoder the data for the block in an uncompressed form that was "missing" from the L2 cache (since there was a line miss or an only partially valid line in the L2 cache).

The data encoder 22 then combines the new uncompressed data for the block read from the L2 cache, together with the required remaining uncompressed data read and decoded for the block from the memory system 6, to provide a new, complete (and modified) set of uncompressed data for the block, and then encodes (compresses) that data appropriately to provide a new compressed version of the block (step 125). The new, compressed version of the block is then written back to the memory system 6 (step 126), and the header data for the set of blocks in question is updated appropriately (step 127).

In this case therefore, rather than simply writing the "new" data from the L2 cache for the data block back to the memory system, a complete new, compressed version of the block is written back to the memory system 6.

This then ensures that a complete compressed block of data is written back to the memory system 6 when data from the L2 cache is to be written back to the memory system in a compressed form. This again helps to ensure coherency and synchronisation of the data blocks as data for the data blocks is transferred to and from the L2 cache.

It will be appreciated from the above that in the technology described herein the compression metadata (i.e. the header data) is stored/provided to the cache as respective "side band" data, e.g. rather than storing the header data with the payload (in the same data structure, e.g. memory page).

Figure 10:
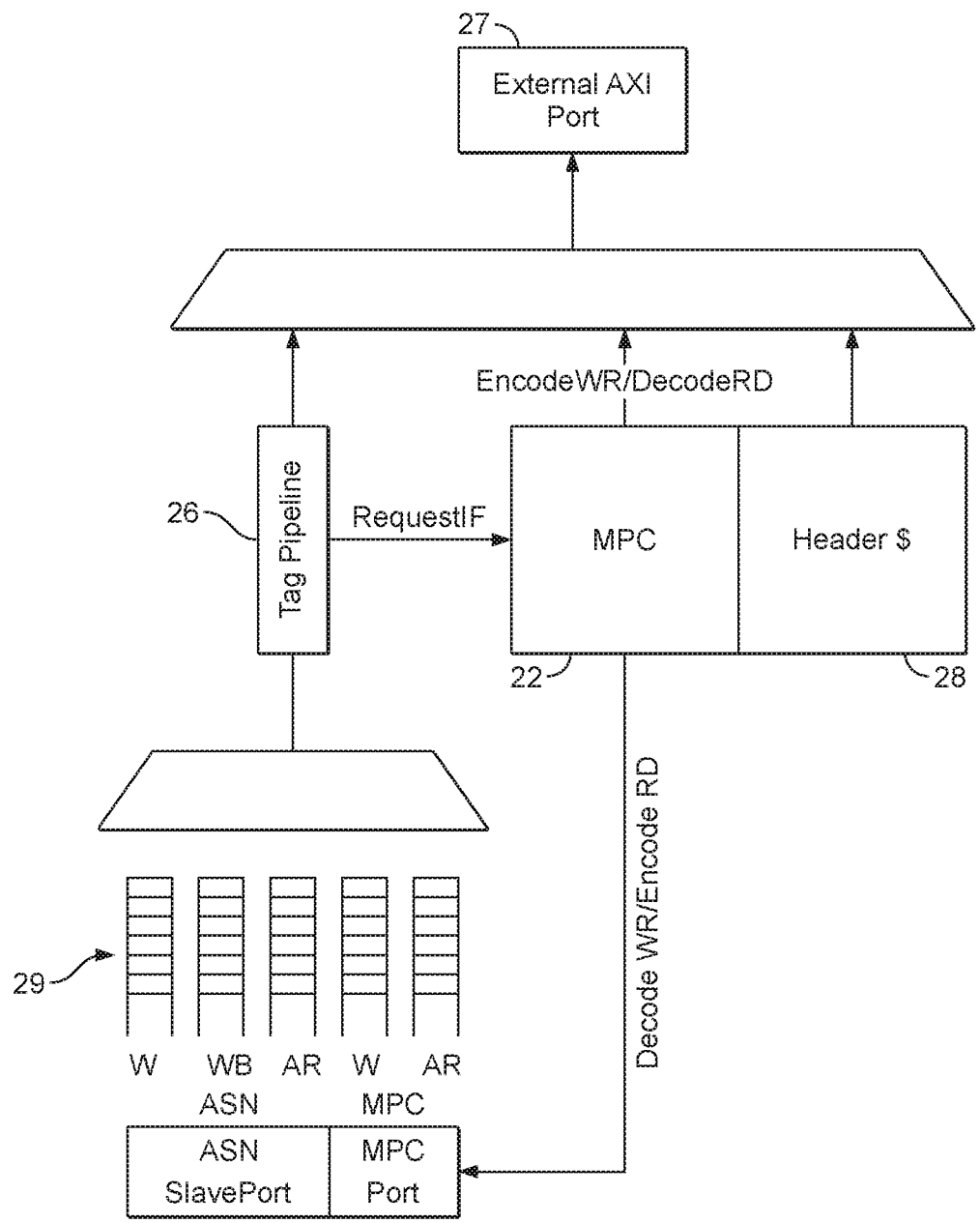
FIG. 10 shows in more detail a cache according to an embodiment.

FIG. 10 shows the integration of the MPC 22 unit within the L2 cache 24. The cache line tag pipeline 26 issues requests ('RequestIF') to the MPC 22 on evict/linefill operations and provides the cache line tags (keys) that are used when performing cache look ups. MPC external traffic is routed directly to the external AXI port 27. MPC internal traffic is routed to the L2 input arbiter and placed into appropriate queues 29 (as shown, there may be multiple queues corresponding to write/read operations on the ASN and MPC). As shown in FIG. 10, there is a separate header cache 28 for storing the compression metadata that is provided, as discussed above, e.g. in a memory tag data field.

When data is being loaded from memory into the L2 cache 24, the compression metadata is thus provided on the AXI interface to the cache as additional side band information (separately from the cache line tag pipeline 26). The MPC 22 is thus able to read the memory tags 74 that are provided in this way to determine how many memory bursts are needed to read in the rest of the data block, etc. The decoded data block can then be written into the cache appropriately and the header data stored in the header cache 28.

Figure 11:
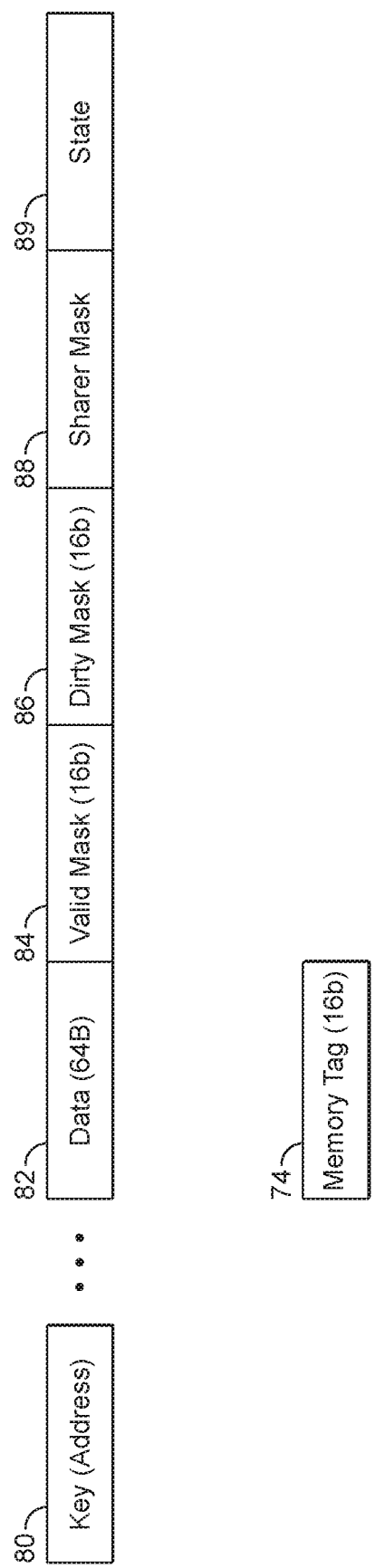
FIG. 11 shows the structure of a cache line according to an embodiment.

FIG. 11 shows the structure of a cache entry in the L2 cache 24 according to the present embodiment. The cache line has a key (i.e. the cache line tag) 80 which in this case comprises a memory address and some associated data which in the present embodiment is stored in a 64 byte cache line. The cache entry further includes a valid mask 84 indicating which bytes of the data are valid, a dirty mask 86 indicating which bytes of the data which are dirty, a sharer mask 88 indicating (in the case of a coherent cache) which lower level sharers keep a copy of the cache line, and a cache line state 89 which contain information about its coherency and general state (common coherent cache protocols include (but not limited to): INVALID, SHARED_VALID, UNIQUE_DIRTY).

The memory tag 74 (which is read on the external AXI port as a side-channel and stores the compression metadata) is not stored in the L2 cache line but is stored in a separate header cache 28 as shown in FIG. 10 since it contains information which is associated with the entire compression block (i.e. the four cache lines in the 256B (or appropriate size) block).

Thus it can be seen from the above that the technology described herein, in its embodiments at least, provides an efficient and effective mechanism for transferring compressed data between a memory system and a graphics processor that is to process that data in an uncompressed form.

Although the present embodiments have been discussed above with particular reference to cache operations in relation to a graphics processor in a graphics processing system, the Applicants have recognised that the use of a data encoder associated with a cache in the manner of the present embodiments discussed above would be useful in other cache arrangements and systems, and not just in the context of graphics processors.

For example, it could be advantageous to integrate a data encoder in the manner of the technology described herein with a system cache that serves plural processors, such as a graphics processor, a display processor, a video processor and an image signal processor (ISP), with the system cache presenting data to the main memory system in a compressed form, and uncompressed to the processors (masters) connected to the system cache.

Whilst the foregoing detailed description has been presented for the purposes of illustration and description, it is not intended to be exhaustive or to limit the technology described herein to the precise form disclosed. Many modifications and variations are possible in the light of the above teaching. The described embodiments were chosen in order to best explain the principles of the technology described herein and its practical applications, to thereby enable others skilled in the art to best utilise the technology described herein, in various embodiments and with various modifications as are suited to the particular use contemplated. It is intended that the scope be defined by the claims appended hereto.

The invention claimed is:

1. A method of operating a data processing system, the data processing system comprising:
a processor;
a memory system; and
a cache system configured to transfer data stored in the memory system to the processor for use by the processor when performing data processing operations and to transfer data from the processor to the memory system;
the cache system comprising a cache configured to receive data from the memory system and to provide data to the processor for use when performing data processing operations and to receive data from the processor for sending to the memory system,
the cache comprising a plurality of cache lines each able to store a respective data entry, wherein cache lines of the plurality of cache lines are associated with respective side band data structures that are separate and distinct from the cache lines;

the method comprising:

when a block of data that is stored in the memory system in a compressed form is to be loaded into the cache, the block of data having a set of associated compression metadata:

storing the block of data into a group of one or more cache lines of the cache; and providing the compression metadata for the block of data in a side band data structure of the side band data structures that is associated with a cache line of the group of one or more cache lines of the cache in which the block of data is stored, such that the compression metadata for the block of data is provided as separate side band data in the side band data structure that is separate and distinct from the cache lines of the cache.

2. The method of claim 1, wherein the compression metadata for the block of data is provided as separate side band data associated with the first cache line of the group of cache lines in which the block of data is stored.

3. The method of claim 1, comprising loading a plurality of compressed blocks of data from the memory system into the cache, wherein each block of data of the plurality of blocks of data is stored into a respective group of one or more cache lines of the cache, and the respective compression metadata for each block of data is provided as separate side band data associated with a cache line of the group of one or more cache lines of the cache in which the respective block of data is stored.

4. The method of claim 3, wherein the plurality of blocks of data correspond to a single memory page.

5. The method of claim 1, wherein the cache system includes a data encoder, wherein when the block of data that is stored in the memory system in a compressed form is to be loaded into the cache, the method comprises decoding the block of data that is provided as compressed data from the memory system and storing the block of data in the cache in an uncompressed format.

6. The method of claim 1, wherein the compression metadata is stored in one or more data fields of the side band data structure that would in another mode of operation be used for storing other information.

7. The method of claim 1, wherein the processor is a graphics processor and wherein the data is data that is required for graphics processing operations performed by the graphics processor.

8. A method of operating a data processing system, the data processing system comprising:

a processor; and a memory system;

the method comprising:

when a block of data is to be stored in the memory system in a compressed form, the block of data having a set of associated compression metadata:

storing the block of data into a respective data structure in the memory system; and storing the compression metadata in a separate and distinct header data structure in the memory system, the separate header data structure including one or more data field, and wherein the compression metadata is stored in a data field of the separate and distinct header data structure that would in a different mode of operation be used for other information.

9. The method of claim 8, wherein the processor is a graphics processor and wherein the data is data that is required for graphics processing operations performed by the graphics processor.

10. A non-transitory computer readable storage medium storing software code that when executing on a data processor performs a method as claimed in claim 1.

11. A data processing system comprising:

a processor;

a memory system; and a cache system configured to transfer data stored in the memory system to the processor for use by the processor when performing data processing operations and to transfer data from the processor to the memory system;

the cache system comprising a cache configured to receive data from the memory system and to provide data to the processor for use when performing data processing operations and to receive data from the processor for sending to the memory system, the cache comprising a plurality of cache lines each able to store a respective data entry, wherein cache lines of the plurality of cache lines are associated with respective side band data structures that are separate and distinct from the cache lines;

the data processing system further including:

a cache control circuit configured to:

when a block of data that is stored in the memory system in a compressed form is to be loaded into the cache, the block of data having a set of associated compression metadata:

store the block of data into a group of one or more cache lines of the cache; and obtain the compression metadata for the block of data from a side band data structure of the side band data structures that is associated with a cache line of the group of one or more cache lines of the cache in which the block of data is stored, such that the compression metadata for the block of data is provided as separate side band data from the side band data structure that is separate and distinct from the cache lines of the cache.

12. The system of claim 11, wherein the compression metadata for the block of data is provided as separate side band data associated with the first cache line of the group of cache lines in which the block of data is stored.

13. The system of claim 11, wherein the cache control circuit is configured to load a plurality of compressed blocks of data from the memory system into the cache, wherein each block of data of the plurality of blocks of data is stored into a respective group of one or more cache lines of the cache, and the respective compression metadata for each block of data is provided as separate side band data associated with a cache line of the group of one or more cache lines of the cache in which the respective block of data is stored.

14. The system of claim 13, wherein the plurality of blocks of data correspond to a single memory page.

15. The system of claim 11, wherein the cache system includes a data encoder that is configured to:

when data is to be written from the cache to the memory system, encode uncompressed data from the cache for storing in the memory system in a compressed format and send the data in the compressed format to the memory system for storing; and when data in a compressed format is to be read from the memory system into the cache, decode the compressed data from the memory system and store the data in the cache in an uncompressed format.

16. The system of claim 11, wherein the compression metadata is stored in one or more data fields of the side band data structure that would in another mode of operation be used for storing other information.

17. The system of claim 11, wherein the processor is a graphics processor and wherein the data is data that is required for graphics processing operations performed by the graphics processor.

18. A data processing system comprising:
a processor; and
a memory system; and
a control circuit configured to:
   when a block of data is to be stored in the memory system in a compressed form, the block of data having a set of associated compression metadata:
      store the block of data into a respective data structure in the memory system; and
      store the compression metadata in a separate header data structure, the separate header data structure including one or more data fields, and wherein the compression metadata is stored in a data field that would in a different mode of operation be used for other information.

19. The system of claim 18, wherein the processor is a graphics processor and wherein the data is data that is required for graphics processing operations performed by the graphics processor.

* * * * *